(12) United States Patent
Hayashi

(10) Patent No.: US 10,580,932 B2
(45) Date of Patent: Mar. 3, 2020

(54) METHOD FOR MANUFACTURING LIGHT-EMITTING DEVICE

(71) Applicant: NICHIA CORPORATION, Anan-shi, Tokushima (JP)

(72) Inventor: Tadao Hayashi, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/849,123

(22) Filed: Dec. 20, 2017

(65) Prior Publication Data

US 2018/0175239 A1  Jun. 21, 2018

(30) Foreign Application Priority Data

Dec. 21, 2016 (JP) .................................. 2016-248528
Feb. 28, 2017 (JP) .................................. 2017-035611
Dec. 11, 2017 (JP) .................................. 2017-237020

(51) Int. Cl.
| | |
|---|---|
| *H01L 33/00* | (2010.01) |
| *H01L 33/32* | (2010.01) |
| *H01L 33/60* | (2010.01) |
| *H01L 33/46* | (2010.01) |
| *H01L 33/38* | (2010.01) |
| *H01L 33/50* | (2010.01) |

(52) U.S. Cl.
CPC ...... *H01L 33/0095* (2013.01); *H01L 33/0075* (2013.01); *H01L 33/32* (2013.01); *H01L 33/387* (2013.01); *H01L 33/46* (2013.01); *H01L 33/60* (2013.01); *H01L 33/508* (2013.01); *H01L 2933/0025* (2013.01); *H01L 2933/0041* (2013.01); *H01L 2933/0058* (2013.01)

(58) Field of Classification Search
None
See application file for complete search history.

(56) References Cited

U.S. PATENT DOCUMENTS

| | | | |
|---|---|---|---|
| 9,287,472 B2 * | 3/2016 | Miki | ................... H01L 33/54 |
| 9,356,206 B2 * | 5/2016 | Wada | .................... H01L 33/505 |
| 9,761,753 B2 * | 9/2017 | Nakabayashi | ........ H01L 33/005 |
| 9,774,010 B2 * | 9/2017 | Okuno | ................ H01L 51/5271 |

(Continued)

FOREIGN PATENT DOCUMENTS

| | | |
|---|---|---|
| JP | 2004-235139 A | 8/2004 |
| JP | 2014-110333 A | 6/2014 |

(Continued)

*Primary Examiner* — Telly D Green
(74) *Attorney, Agent, or Firm* — Foley & Lardner LLP

(57) ABSTRACT

A method for manufacturing a light-emitting device includes: providing a light-transmissive member comprising: a base portion, and a projecting portion on a first surface side of the base portion; providing a light-emitting element that has a main emitting surface and an electrode formation surface opposite to the main emitting surface; disposing the light-emitting element on the projecting portion of the light-transmissive member such that the main emitting surface of the light-emitting element faces an upper surface of the projecting portion of the light-transmissive member; and forming a light-reflective member that covers at least one of (i) lateral surfaces of the light-emitting element, and/or (ii) lateral surfaces of the projecting portion of the light-transmissive member.

8 Claims, 16 Drawing Sheets

(56) References Cited

U.S. PATENT DOCUMENTS

| | | | |
|---|---|---|---|
| 9,780,258 B2* | 10/2017 | Shichijo | H01L 33/20 |
| 9,929,324 B2* | 3/2018 | Miki | H01L 33/54 |
| 10,186,646 B2* | 1/2019 | Hashimoto | H01L 33/60 |
| 2007/0109792 A1 | 5/2007 | Chosa et al. | |
| 2009/0086508 A1* | 4/2009 | Bierhuizen | G02B 6/0018 |
| | | | 362/617 |
| 2010/0320479 A1 | 12/2010 | Minato et al. | |
| 2014/0042481 A1 | 2/2014 | Inoue et al. | |
| 2014/0339582 A1 | 11/2014 | Matsumura et al. | |
| 2015/0001563 A1* | 1/2015 | Miki | H01L 33/54 |
| | | | 257/98 |
| 2015/0102366 A1* | 4/2015 | Wada | H01L 33/505 |
| | | | 257/88 |
| 2015/0171287 A1* | 6/2015 | Matsumura | H01L 33/50 |
| | | | 438/27 |
| 2015/0325748 A1 | 11/2015 | Ting et al. | |
| 2015/0333227 A1 | 11/2015 | Lee et al. | |
| 2016/0109099 A1* | 4/2016 | Okuno | H01L 51/5271 |
| | | | 362/551 |
| 2016/0155914 A1* | 6/2016 | Miki | H01L 33/54 |
| | | | 257/98 |
| 2016/0240732 A1 | 8/2016 | Huang et al. | |
| 2016/0240741 A1 | 8/2016 | Kuo et al. | |
| 2016/0240744 A1 | 8/2016 | Huang et al. | |
| 2016/0240751 A1 | 8/2016 | Ting et al. | |
| 2016/0240758 A1 | 8/2016 | Huang et al. | |
| 2016/0247788 A1 | 8/2016 | Huang et al. | |
| 2016/0247964 A1 | 8/2016 | Ting et al. | |
| 2016/0247972 A1 | 8/2016 | Kuo et al. | |
| 2016/0247974 A1 | 8/2016 | Huang et al. | |
| 2016/0247982 A1 | 8/2016 | Ting et al. | |
| 2016/0247985 A1 | 8/2016 | Huang et al. | |
| 2016/0254428 A1 | 9/2016 | Ting et al. | |
| 2016/0276293 A1 | 9/2016 | Hung et al. | |
| 2016/0276320 A1 | 9/2016 | Hung et al. | |
| 2016/0276543 A1 | 9/2016 | Hung et al. | |
| 2016/0276546 A1 | 9/2016 | Lee et al. | |
| 2016/0276547 A1 | 9/2016 | Hung et al. | |
| 2016/0284666 A1 | 9/2016 | Lee et al. | |
| 2016/0307880 A1 | 10/2016 | Huang et al. | |
| 2016/0315238 A1 | 10/2016 | Kuo et al. | |
| 2016/0329461 A1 | 11/2016 | Huang et al. | |
| 2017/0005238 A1 | 1/2017 | Hung et al. | |
| 2017/0025572 A1* | 1/2017 | Shichijo | H01L 33/20 |
| 2017/0062653 A1 | 3/2017 | Huang et al. | |
| 2017/0084587 A1 | 3/2017 | Hung et al. | |
| 2017/0084800 A1 | 3/2017 | Hung et al. | |
| 2017/0125645 A1 | 5/2017 | Ting et al. | |
| 2017/0200873 A1* | 7/2017 | Nakabayashi | H01L 33/005 |
| 2017/0309787 A1 | 10/2017 | Huang et al. | |
| 2017/0323870 A1 | 11/2017 | Ting et al. | |
| 2017/0338375 A1 | 11/2017 | Ting et al. | |
| 2018/0094796 A1* | 4/2018 | Hayashi | F21V 9/30 |
| 2018/0151785 A1* | 5/2018 | Hashimoto | H01L 33/60 |
| 2018/0269363 A1* | 9/2018 | Iwakiri | H01L 33/505 |

FOREIGN PATENT DOCUMENTS

| | | |
|---|---|---|
| JP | 2015-008329 A | 1/2015 |
| JP | 2016-213451 A | 12/2016 |
| TW | 201703286 A | 1/2017 |
| WO | WO-2009/069671 A1 | 6/2009 |
| WO | WO-2012/144030 A1 | 10/2012 |
| WO | WO-2012/169289 A1 | 12/2012 |
| WO | WO-2014/002784 A1 | 1/2014 |

* cited by examiner

Fig. 1 2 B
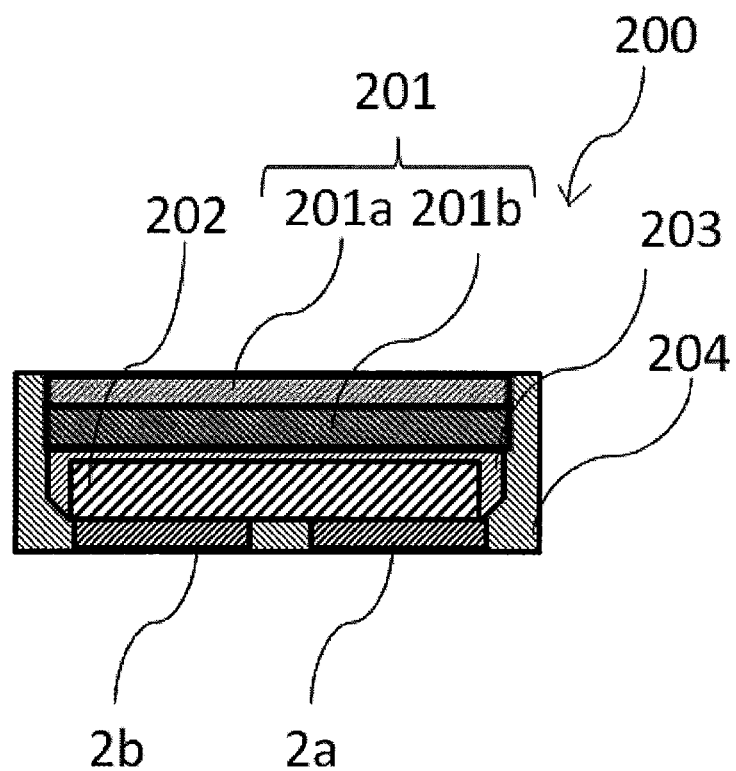

METHOD FOR MANUFACTURING LIGHT-EMITTING DEVICE

CROSS-REFERENCE TO RELATED APPLICATION

This application claims priority to Japanese Patent Application No. 2016-248528 filed on Dec. 21, 2016, Japanese Patent Application No. 2017-035611 filed on Feb. 28, 2017, and Japanese Patent Application No. 2017-237020 filed on Dec. 11, 2017, the disclosures of which are hereby incorporated by reference in their entireties.

BACKGROUND

The present disclosure relates to a method for manufacturing a light-emitting device.

Light source devices in which light-emitting elements are incorporated have conventionally been proposed that can be suitably used as backlights for apparatus such as mobile phones and digital cameras (for example, Japanese Patent Publication No. 2004-235139). A linear light source device disclosed in Japanese Unexamined Patent Application Publication No. 2004-235139 includes: a plurality of light-emitting elements arranged at predetermined intervals along the longitudinal direction of a rectangular rod-shaped wiring board, and die-bonded thereto; reflectors arranged at both sides of each of the light emitting elements such that the reflectors and the light emitting elements are arranged alternately; and the opposing surfaces of the reflectors being inclined such that the distance between the opposing surfaces increases toward the opening of the reflector along the emission direction of light from the light emitting element. This structure enables the whole device to be reduced in size and slimmed down and provides linear light with high luminance and only slight non-uniformity in luminance.

SUMMARY

However, in the manufacture of such a linear light source device as disclosed in Japanese Unexamined Patent Application Publication No. 2004-235139, the more the light source device is reduced in size or slimmed down, the more difficult the manufacturing thereof becomes.

The present disclosure has been made in view of the above-mentioned situation. One object of the present disclosure is to provide a method for easily manufacturing a small or slim light-emitting device.

In one embodiments, a method for manufacturing a light-emitting device includes: providing a light-transmissive member which has a base portion and at least one projecting portion on a first surface side of the base portion; providing at least one light-emitting element that has a main emitting surface and an electrode formation surface opposite to the main emitting surface; disposing the at least one light-emitting element on the respective projecting portion of the light-transmissive member such that the main emitting surface of the light-emitting element faces an upper surface of the projecting portion of the light-transmissive member; and forming a light-reflective member that covers at least one of (i) lateral surfaces of the light-emitting element, and/or (ii) lateral surfaces of the projecting portion of the light-transmissive member.

In another embodiment, a method for manufacturing a light-emitting device includes: providing a base member for a light-transmissive member; providing at least one light-emitting element that has a main emitting surface and an electrode formation surface opposite to the main emitting surface; disposing the at least one light-emitting element on the base member such that the main emitting surface of the at least one light-emitting element faces a first surface of the base member; forming a light transmissive-member comprising a base portion and a projecting portion above the base portion by forming at least one depressed portion in the base member, such that the at least one light-emitting element is disposed on the projecting portion; and forming a light-reflective member that covers lateral surfaces of the at least one light-emitting element and lateral surfaces of the projecting portion of the light-transmissive member.

By these methods, a small or slim light-emitting device can be manufactured easily.

BRIEF DESCRIPTION OF THE DRAWINGS

FIG. 12B is a schematic sectional view of the light-emitting device in FIG. 12A.

DETAILED DESCRIPTION

Figure 1:
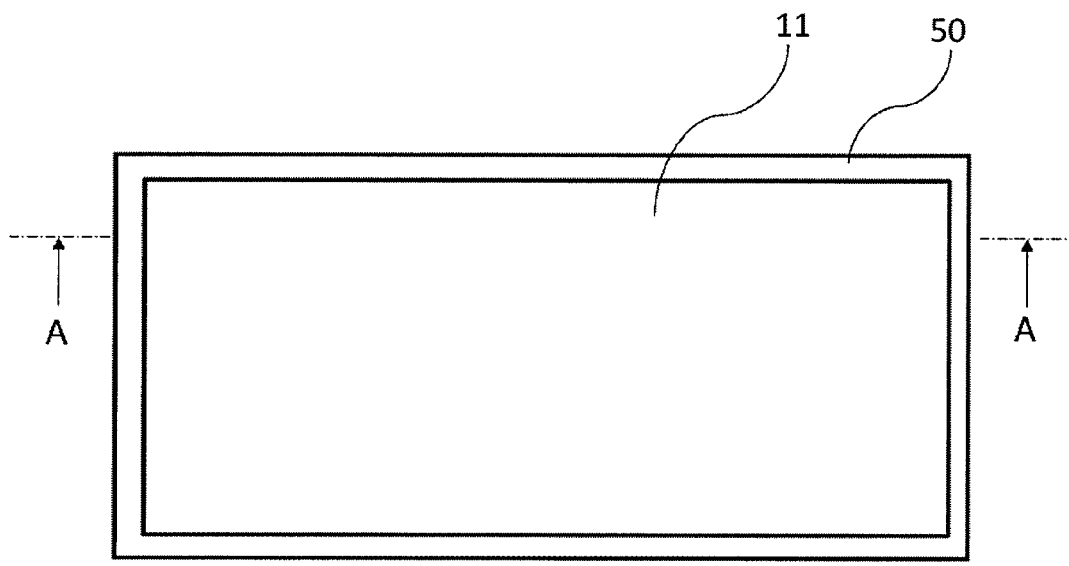
FIG. 1A is a schematic plan view of a base member for a light-transmissive member according to a first embodiment.
FIG. 1B is a schematic sectional view taken along the line A-A in FIG. 1A.
Figure 1:
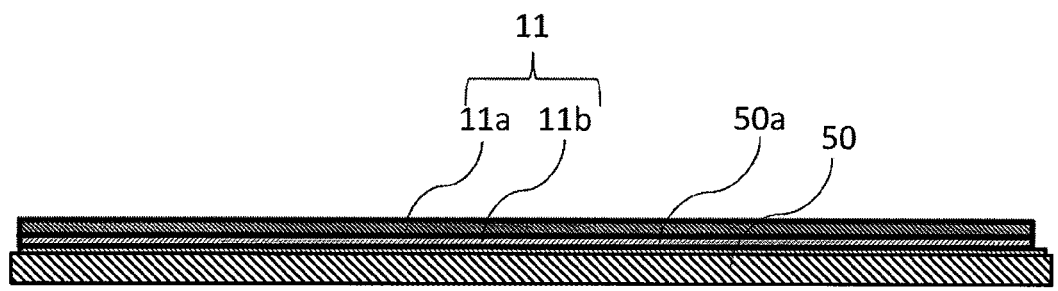

Certain embodiments of the invention are described below with reference to the accompanying drawings Light-emitting devices described below are intended to embody the technical concepts of the present invention, but the invention is not limited to the devices below unless specifically stated otherwise. Constitutions described with respect to one embodiment or example are applicable to other embodiments and examples. Magnitudes, aspect ratios, or positional relations of members illustrated in the drawings may be exaggerated or omitted in order to clarify or facilitate the descriptions.

In the present specification, a light-emitting device has the light-extracting surface that has a longitudinal direction side (I.e., a relatively long side) and a width direction side (I.e., a relatively short side), and the term "slimming down" means reducing the length in the width direction, and a "slim" light-emitting device means a light-emitting device having a short length in the width direction.

The light-extracting surface in the present specification is a surface of each member from which light is emitted when the resulting light-emitting device emits light.

According to one embodiment, a method for manufacturing a light-emitting device includes: providing a light-transmissive member which has a base portion and at least one projecting portion on a first surface side of the base portion; providing at least one light-emitting element that has a main emitting surface and an electrode formation surface opposite to the main emitting surface; disposing the at least one light-emitting element on the respective projecting portion of the light-transmissive member such that the main emitting surface of the light-emitting element faces an upper surface of the projecting portion of the light-transmissive member; and forming a light-reflective member that covers at least one of lateral surfaces of the light-emitting element and lateral surfaces of the projecting portion of the light-transmissive member.

The precision of the position and shape of the emitting surface is enhanced by disposing the light-emitting element in this manner on the projecting portion of the light-transmissive member that includes the base portion and the projecting portion. Also, disposing the light-emitting element on the projecting portion of the light-transmissive member realizes precise alignment of the light-transmissive member with the light-emitting element even in the case where the width of the light-transmissive member to serve as the emitting surface is small. Forming the light-reflective member that covers the lateral surfaces of the projecting portion enhances the precision of the positions and shapes of the emitting surface of the light-emitting device and the light-reflective member that encloses the emitting surface. This realizes manufacturing a small or slim light-emitting device.

According to another embodiment, a method for manufacturing a light-emitting device includes: providing a base member for a light-transmissive member; providing at least one light-emitting element that has a main emitting surface and an electrode formation surface opposite to the main emitting surface; disposing the at least one light-emitting element such that the main emitting surface of the at least one light-emitting element faces a first surface of the light-transmissive member; forming at least one base portion and at least one projecting portion above the base portion in the base member for the light-transmissive member, the projecting portion comprising at least one portion on which the at least one light-emitting element is disposed, by forming at least one depressed portion in the base member for the light-transmissive member; and forming a light-reflective member that covers lateral surfaces of the at least one light-emitting element and lateral surfaces of the at least one projecting portion of the light-transmissive member.

By forming the depressed portion around the light-emitting element disposed on the upper surface of the light-transmissive member, the projecting portion and the light-reflective member can be formed in such a manner as to cover the lateral surfaces of the projecting portion, thereby enabling enhancement of the precision of the positions and shapes of the emitting surface of the light-emitting device and the light-reflective member that encloses the emitting surface is enhanced. Also, forming the depressed portion that defines the position of the light-reflective member after disposing the light-emitting element on the light-transmissive member enables precise alignment of the light-emitting element with the light-reflective member while keeping the width of the light-transmissive member to serve as the emitting surface, small. This realizes manufacturing a small or slim light-emitting device.

First Embodiment

Figure 10A:
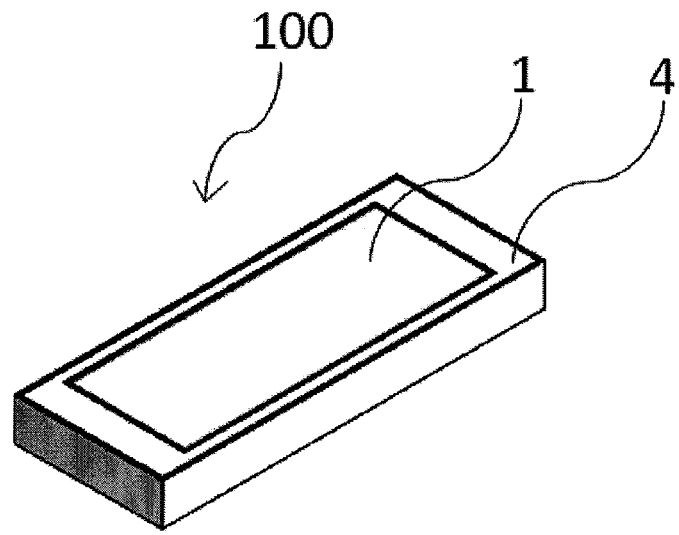
FIG. 10A is a schematic perspective view of the light-emitting device according to the first embodiment.
Figure 10B:
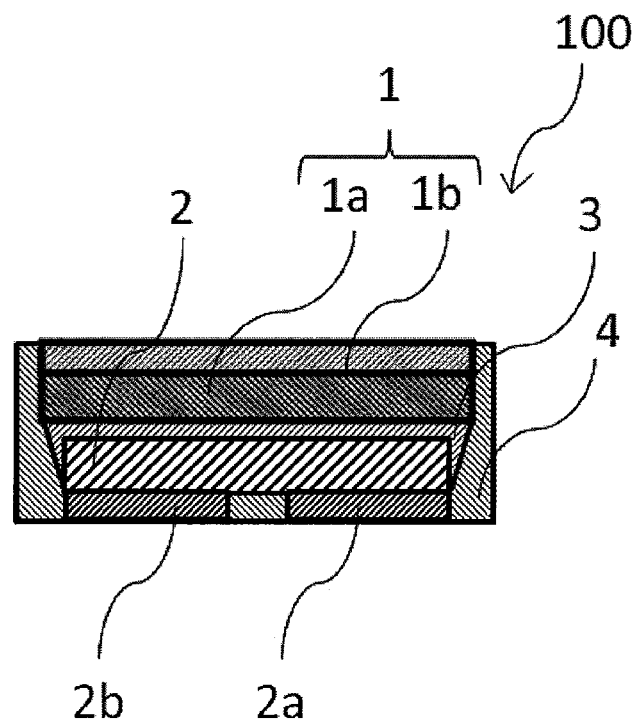
FIG. 10B is a schematic sectional view of the light-emitting device in FIG. 10A.

FIG. 10A and FIG. 10B show a light-emitting device 100 manufactured by a manufacturing method in a first embodiment. The light-emitting device 100 includes a light-emitting element 2 having the longitudinal direction sides and the width direction sides in a plan view, a light-transmissive encapsulating member 1 having the longitudinal direction sides and the width direction sides in a plan view, a light-transmissive adhesive 3 that bonds the light-emitting element 2 to the light-transmissive encapsulating member 1, and a light-reflective member 4 that covers the lateral surfaces of the light-emitting element 2, the light-transmissive adhesive 3, and the lateral surfaces of the light-transmissive encapsulating member 1. The longitudinal direction sides of the light-emitting element 2 coincides with the longitudinal direction sides of the light-transmissive encapsulating member 1.

The light-emitting device can be obtained by, for example, the manufacturing method including the following steps.

Figure 2A:
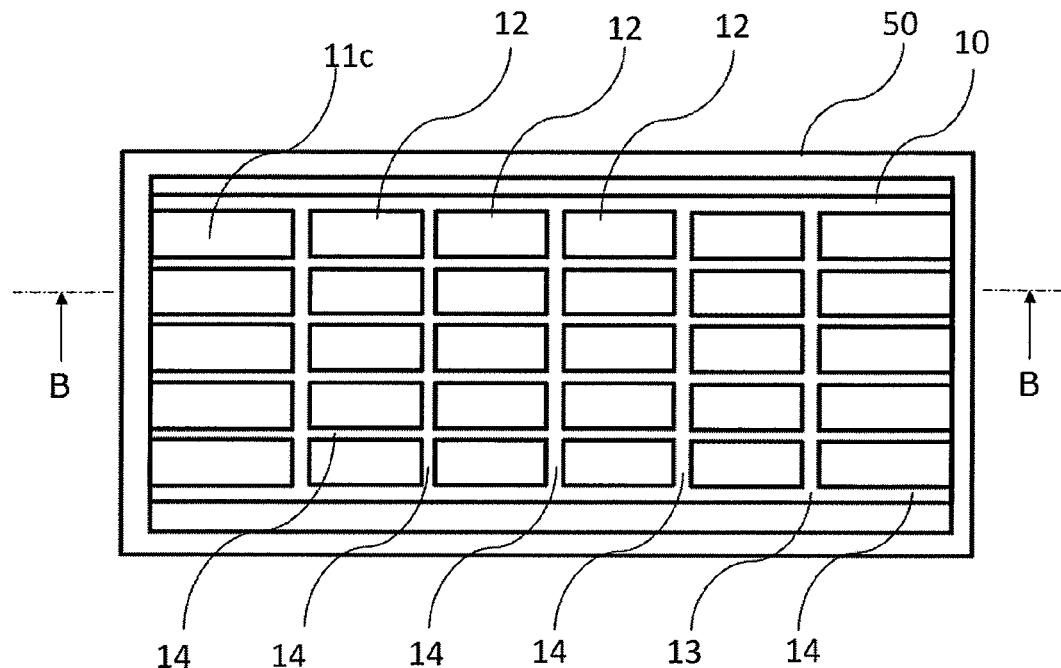
FIG. 2A is a schematic plan view for illustrating a step in a method for manufacturing a light-emitting device according to a first embodiment.
Figure 2B:
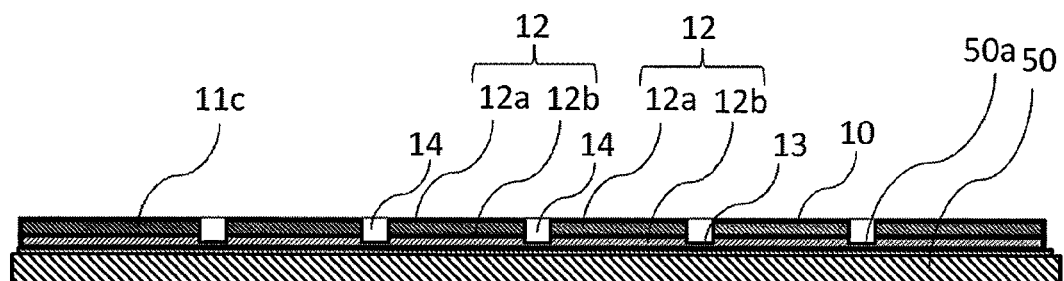
FIG. 2B is a schematic sectional view taken along the line B-B in FIG. 2A.
Figure 2C:
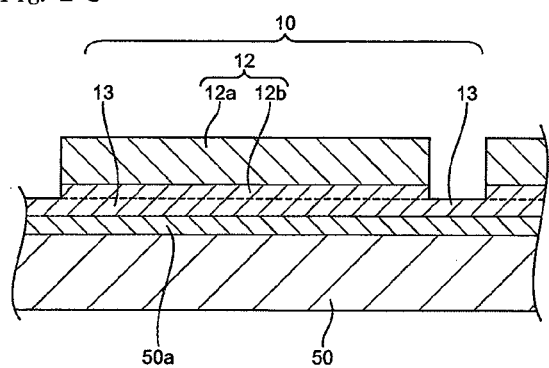
FIG. 2C is an enlargement of a portion of a schematic sectional view shown in FIG. 2B.

The method for manufacturing the light-emitting device 100 in the present embodiment is described in detail below.
1. Providing Light-Transmissive Member A light-transmissive member 10 including a base portion 13 and projecting portions 12 on a first surface side of the base portion 13 is provided as shown in FIG. 2A, FIG. 2B, and FIG. 2C. FIG. 2C is an enlargement of a portion of a schematic cross-sectional view shown in FIG. 2B for clearly illustrating the base portion 13 and the projecting portions 12.

In the present embodiment, a surface of each of the projecting portions 12 of the light-transmissive member that are finally exposed from the light-reflective member serves as a light-emitting surface of the light-emitting device 100. Thus, the light-transmissive member 10 in the longitudinal direction and the width direction respectively have equal lengths to lengths of the light-emitting device 100 in the longitudinal direction and the width direction in a plan view. In the present specification, "equal length" or the substantially the same term means that approximately ±10% or less of tolerance is acceptable. That is, in the present embodiment, the lengths of the upper surface and a lower surface of each of the protruding portions 12 of the light-transmissive member in the longitudinal direction viewed from the top of the protruding portions 12 can respectively have a tolerance within approximately ±10% or less of the lengths of the light-emitting surface of the light-emitting device 100 in the longitudinal direction. Similarly, the length of the upper surface and the lower surface of each of the protruding portions 12 in the width direction viewed from the top of the protruding portions 12 can respectively have a tolerance within approximately ±10% or less of the lengths of the emitting surface of the light-emitting device 100 in the longitudinal direction. In the present embodiment, the lateral surfaces of the protruding portions can be inclined such that the light-emitting devices 100 each have a larger or smaller light-emitting surface. In such a case, the lengths of each of the protruding portions 12 of the light-transmissive member in the longitudinal and width directions viewed from the top may be equal to or not equal to the lengths of the light-emitting surface of the light-emitting device 100 in the longitudinal and width direction. Preferably, the protruding portions 12 in the present embodiment can be formed such that the length in the width direction of a surface on the light-extracting surface side (i.e., lower surface of the protruding portion 12) which faces the supporting member 50 is substantially equal to the length in the width direction of the light-emitting surface of the emitting device 100. In the present embodiment, the lateral surfaces of the protruding portions 12 may include a rough surface, and the lengths of the emitting surface of the light-emitting device 100, and the lengths of the upper surface and the lower surface of the protruding portions 12 in the longitudinal or width direction can be compared using the smallest, longest or average length so long as the same reference is used.

In the present embodiment, the light-transmissive member having the longitudinal direction sides and the width direction sides in a plan view and including the base portion and the projecting portions is provided by disposing a base member 11 for the light-transmissive member having a sheet shape on the supporting member 50 and removing part of the base member to a certain point in the thickness direction of the base member to form the projecting portions 12 as described below.

The step of providing the light-transmissive member is described in detail below.
1-1. Shaping Base Member for Light-Transmissive Member The base member 11 in a sheet shape for the light-transmissive member is first formed. The figures referred below show an exemplified structure of a base member 11 of a light-transmissive member including a phosphor-containing layer 11a, in which at least one type of phosphor is contained, and phosphor-free layer 11b, in which substantially no phosphor is contained.

The sheet-shaped base member 11 for the light-transmissive member can be formed in a substantially uniform thickness by, for example, compression-molding, transfer-molding, injection-molding, spraying, printing, potting, or electrophoretic deposition. The base member 11 having a sheet shape can be formed with a material of liquid resin, and when necessary, one or more phosphors can be mixed with the liquid resin material.
1-2. Disposing Base Member for Light-Transmissive Member on Supporting Member Subsequently, the base member 11 for the light-transmissive member having a sheet shape is disposed on the supporting member 50 as shown in FIG. 1A and FIG. 1B. In the present embodiment, the light-extracting surface of the base member 11 for the light-transmissive member is attached to the supporting member having an adhesive layer 50a on its upper surface. For the supporting member 50, resin films, metal plates, resin plates, and ceramic plates can be used singly or in combination. Regardless of what material is used for the supporting member, the supporting member 50 preferably has an adhesive layer 50a, more preferably an ultraviolet-curable (UV-curable) adhesive layer, on one surface. Employing such an adhesive layer 50a enables the supporting member 50 to stably hold the base member 11 for the light-transmissive member. In addition, the adhesive layer 50a more preferably has heat resistance to withstand a thermal history including curing of resin through the following steps. The base member 11 for the light-transmissive member may be disposed on the supporting member 50 by forming the base member 11 for the light-transmissive member on the supporting member 50.
1-3. Forming Projecting Portion of Light-Transmissive Member Subsequently, as shown in FIG. 2A and FIG. 2B, part in a thickness direction of the base member 11 of the light transmissive member is removed to have a groove shape while the base member 11 is disposed on the support member 50 in order to form a plurality of projecting portions 12 each having the longitudinal direction sides and the width direction sides in a plan view. In the present embodiment, the projecting portions 12 are formed in a four-by-five matrix, around which remaining portions 11*c* that remains after cutting the base member 11 for the light-transmissive member are located. The projecting portions 12 are connected to the remaining portions 11*c* via a base portion 13.

The grooves 14, and thus projecting portions 12 of the base member 11 for the light-transmissive member, can be formed by, for example, dicing, punching (e.g., machining using Thomson blade), ultrasonic machining, or laser machining. Dicing is particularly preferable due to its good straightness described later in order to form the grooves 14 and to achieve spacing between adjacent projecting portions 12 of the light-transmissive member Particularly in the case where the light-transmissive member contains a phosphor vulnerable to moisture (e.g., a KSF phosphor), a method using no water is preferable. Degradation of the light-transmissive member is thus reduced.

The formation of the projecting portions essentially demarcates the shape of the emitting surfaces, particularly the shapes of sides along the longitudinal direction in a plan view, of the light-emitting device 100, the cutting is preferably performed by a method that achieves good straightness. The good straightness for forming the protruding portions is also needed to define shapes of the sides of the protruding portions in the width direction. In the case where such straightness cannot be achieved, a desired shape of the emitting surface of the light-emitting device 100 may not be obtained. Such variances in the shape of the projecting portions 12 of the light-transmissive member makes it difficult to control the thickness of the light-reflective member 4 described later because the light-reflective member 4 covers the lateral surfaces of the light-transmissive encapsulating members 1. Hence, the emission direction cannot be sufficiently controlled by the light-reflective member 4. Properties of the light-emitting device 100, such as the luminance and light incidence efficiency on a light-guiding plate, may thus degrade. Particularly, in the case where a plurality of light-emitting elements are disposed on each of the projection portions as shown in a later described variation 1, the good straightness in dicing is needed because the sides of the emitting surface in the longitudinal direction defined by the sides of the protruding portions in the longitudinal direction (indicated by L4 in FIG. 13C) become longer.

A required degree of linearity of the sides along the longitudinal direction of one of the projecting portions 12 of the light-transmissive member varies depending on the thickness of the light-reflective member 4 covering the lateral surfaces of the light-transmissive encapsulating member 1. Particularly, in order to obtain a light-emitting device 100 having a high-output while being slim, the ratio of the length in the width direction of the light-transmissive encapsulating member 1 (sides L5 in FIG. 13C) that constitutes the emitting surface is needed to be increased on the surface side that is configured with the light-emitting surface and the surface of the light-reflective member 4 surrounding the light-emitting surface, with respect to the thickness of the light-reflective member 4 is needed to be reduced while ensuring the necessary thickness. Hence, the projecting portions 12 of the light-transmissive member are required to be formed by cutting with high linearity across the entire length of the light-emitting device 100. Specifically, the linearity is preferably high enough to allow the light-reflective member 4 to have a thickness of about 10 μm to about 100 μm, preferably about 20 μm to about 50 μm, over the entire lateral surfaces of the light-emitting device 100.

In the present specification, the statement that linearity of a member is high means that the distance between an imaginary line that is parallel to a predetermined side of the member and passes through the innermost point of the periphery of the member and the outermost point of the periphery of the member is small.

Cutting with high straightness in the present specification means that the cutting can achieve high linearity.

The projecting portions can each have a rectangular, square, hexagonal, octagonal, circular, or elliptic shape or a shape similar to the above-mentioned shape in a plan view.

The foregoing is an exemplification where the protruding portions 12 are obtained by forming the grooves in lattice shape. In the present embodiment, however, the protruding portions 12 can be obtained by forming the grooves 14 in only one direction. That is, each of the grooves 14 can be defined by only two facing sides of the lateral surfaces of the intended light-transmissive encapsulating member 1. The protruding portions 14 may be formed by, for example, the grooves 14 being parallel to each other on the plurality of base members 11 which each have a band shape and are away from each other, for example, such that the.

Forming the projecting portions 12 connected to one another via the base portion 13 reduces the risk of deformation of the projecting portions 12. The handleability in the manufacturing process of a light-transmissive member 10 is thus improved, thereby facilitating mass production of the light-emitting device.

As such, the protruding portions 12 can be defined by the grooves 14 formed by removing part of the base member 11 of the light-transmissive member, whereas spaces, in which the light-reflective members 4 are to be formed, can be provided on the lateral surfaces of the light-transmissive encapsulating members 1. In forming the protruding portions 12 of the light-transmissive member, the grooves can be formed without allowing the base portion 13 to remain at the bottom of the grooves in order to obtain spaces in which the light-reflective member 4 is to be formed while the adjacent protruding portions 12 are separate to each other. The protruding portions 12 formed by the grooves as mentioned above can provide the spaces in which the light-reflective member 4 is to be formed without transferring the light-transmissive member or expanding the sheet as described later. This can be achieved easily by a cutting method that generates cutting margins, such as dicing. The distance between the projecting portions 12 is sufficient so long as it is suitable for the thickness of the light-reflective member 4 to be disposed and the method for cutting the light-reflective member 4. The distance is preferably, for example, about 30 μm to about 300 μm, more preferably about 30 μm to about 200 μm. This structure makes the light-emitting device 100 slim while providing a sufficient thickness of the light-reflective member 4.

The method for forming the projecting portions 12 of the light-transmissive member can be appropriately selected other than the methods including the above-mentioned cutting. A shape including the base portion 13 and the projecting portions 12 may be formed by, for example, compression molding, transfer molding, injection molding, screen printing, or spraying.

A first surface on which the light-emitting element 2 is disposed of each of the projecting portions 12 of the light-transmissive member may be different in shape from a second surface, which is to be the emitting surface of the light-emitting device, and opposite to the first surface. For example, the first surface on which the light-emitting element 2 is disposed may be smaller or larger than the second surface, which is to be the emitting surface. The light-transmissive member having such a shape can be formed by, for example, using a V-shaped or inverted V-shaped blade to cut the base member 11 for the light-transmissive member in the present embodiment.

2. Disposing Light-Emitting Element on Projecting Portion of Light-Transmissive Member Subsequently, the light-emitting element 2 is disposed on each projecting portion 12 of the light-transmissive member with the light-transmissive adhesive 3 disposed therebetween such that the main emitting surface of the light-emitting element 2 faces the upper surface of the projecting portion 12.

In the present specification, the surface of the projecting portion 12 on which the light-emitting element 2 is disposed may be referred to as the upper surface of the projecting portion 12.

In the present embodiment, it is preferable that each light-emitting element 2 be disposed on the corresponding projecting portion 12 of the light-transmissive member 10 with the light-transmissive member 10 shaped and provided on the supporting member 50 being held by the supporting member 50, in other words, without moving or transferring the light-transmissive member 10 from the supporting member 50. A light-transmissive member 10 containing resin, particularly a silicone resin, as a base material is soft, and the projecting portion 12, which constitutes the emitting surface, of the light-transmissive member is formed into a narrow shape to provide a slim light-emitting device 100. Moving or transferring such a member is generally difficult. In particular, the projecting portion 12 of the light-transmissive member being soft and narrow may have a possibility to be twisted or bent during moving or transferring. In such a case, it is difficult to maintain the linearity described above of the projecting portion 12 of the light-transmissive member. Hence, it is preferable to shape the light-transmissive member 10 on the supporting member 50, and dispose the light-emitting element 2 on the projecting portion 12 of the light-transmissive member with the light-transmissive member 10 being held by the same supporting member 50 without transferring or moving from the supporting member 50.

The projecting portion 12 of the light-transmissive member is connected to the base portion 13 in the present embodiment, its shape is comparatively stable. Hence, transferring from the supporting member 50 to another supporting member may be performed before disposing the light-emitting element 2 and after forming the projecting portions 12.

The step of disposing the light-emitting elements on the protruding portions is described in detail below.

2-1. Applying Liquid Resin Material

Figure 3:
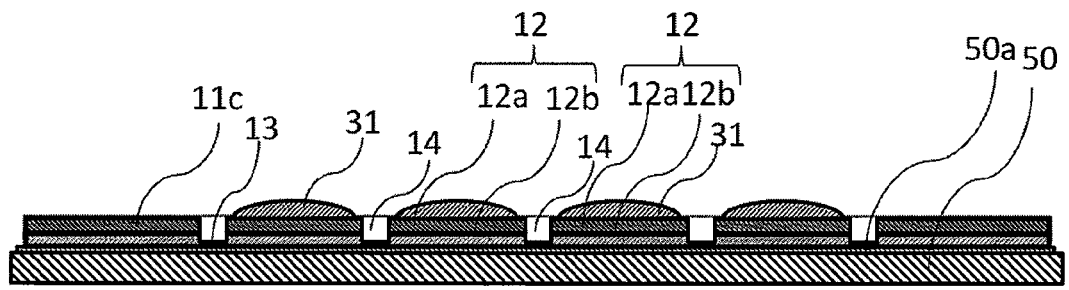
FIG. 3 is a schematic sectional view for illustrating a step in the method for manufacturing the light-emitting device according to the first embodiment.

In disposing of the light-emitting element 2 on the projecting portion 12 of the light-transmissive member in the present embodiment, a liquid resin material 31 that is to be cured to constitute the light-transmissive adhesive 3 is first applied on the upper surface of each projecting portion 12 of the light-transmissive member as shown in FIG. 3.

A method such as pin transfer, dispensing, and printing can be used for the application. The liquid resin material 31 applied may be separated into a plurality of islands or disposed as a continuous line on one projecting portion 12 of the light-transmissive member.

The amount of application is only required to be large enough to bond the light-emitting element 2 to the light-transmissive encapsulating member 1, and can be appropriately adjusted depending on the sizes and numbers of the light-transmissive encapsulating members 1 and light-emitting elements 2 and the required bonding strength. It is preferable that the light-transmissive adhesive 3 be disposed on the lateral surfaces of the light-emitting element 2 in addition to the gap between the light-extracting surface of the light-emitting element 2 and the light-transmissive encapsulating member 1. This structure allows light from the lateral surfaces of the light-emitting element 2 to be extracted, thereby improving the light extraction efficiency of the light-emitting device 100.

2-2. Disposing Light-Emitting Element

Figure 4:
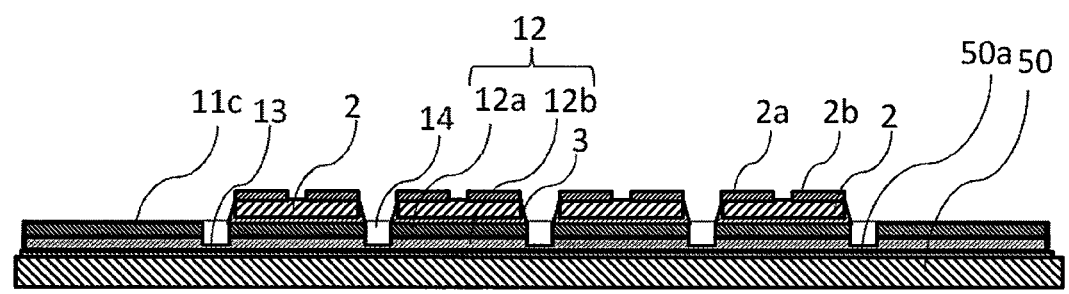
FIG. 4 is a schematic sectional view for illustrating a step in the method for manufacturing the light-emitting device according to the first embodiment.

Subsequently, each light-emitting element 2 that has the main emitting surface and an electrode formation surface opposite to the main emitting surface is disposed on the liquid resin material 31 such that the main emitting surface faces the light-transmissive member side as shown in FIG. 4. At this time, the longitudinal direction sides of the light-emitting element (i.e., sides L7 in FIG. 16A) preferably coincides with the longitudinal direction sides of the projecting portion 12 of the light-transmissive member.

In the disposing of the light-emitting element 2, positioning of the liquid resin material 31 to be the light-transmissive adhesive 3 and the light-emitting element 2 is preferably performed at an edge of the projecting portion 12 of the light-transmissive member in a plan view. For example, the ends of the sides along the longitudinal direction of the projecting portion 12 of the light-transmissive member preferably coincide with ends of the light-transmissive adhesive 3. Allowing the light-emitting element 2 to self-align along the sides along the longitudinal direction of the projecting portion 12 in this way enables the light-emitting elements 2 to be easily and precisely disposed in a row on the narrow projecting portion 12.

Figure 13A:
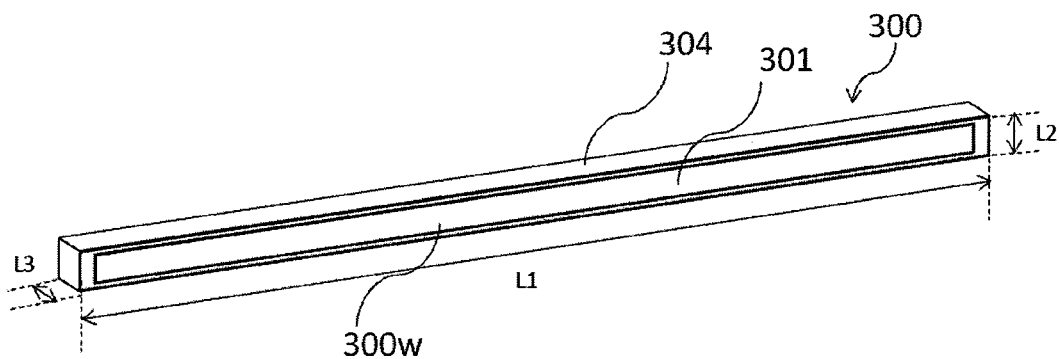
FIG. 13A is a schematic perspective view of a light-emitting device according to Example 3.

The length in the width direction of the projecting portion 12 (i.e., L5 in FIG. 2A) is preferably about 1 time to 2 times the length in the width direction of the light-emitting element 2 (i.e., L8 in FIG. 13A), more preferably about 1.2 to 1.5 times the length thereof. This structure can make the light-emitting device 100 slim while obtaining the self-alignment effect.

2-3. Curing Liquid Resin Material

Subsequently, the liquid resin material 31 is cured by heat or ultraviolet light to bond the light-emitting elements 2 to the projecting portions 12 of the light-transmissive member. At this time, the light-transmissive adhesive 3 is preferably formed into a shape broadening toward the light-extracting surface side from the lower surface, which is the surface opposite to the light-extracting surface of the light-emitting element 2, the light-extracting surface facing the projecting portion 12 of the light-transmissive member. The light-emitting device 100 can thus exhibit a high light extraction efficiency.

3. Forming Light-Reflective Member

Figure 5:
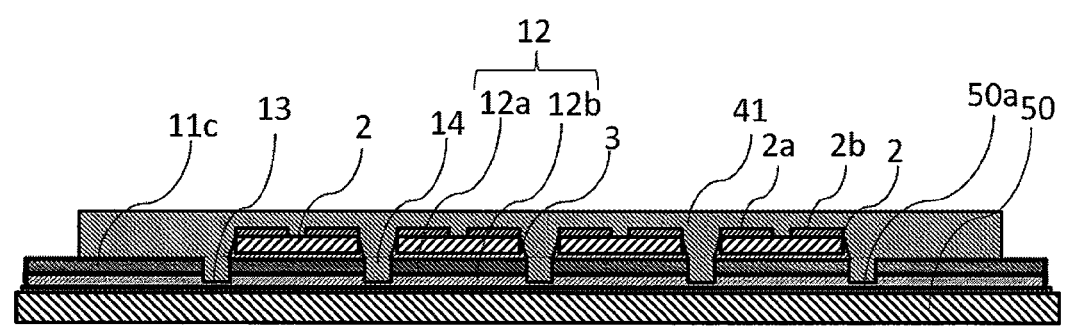
FIG. 5 is a schematic sectional view for illustrating a step in the method for manufacturing the light-emitting device according to the first embodiment.
Figure 6:
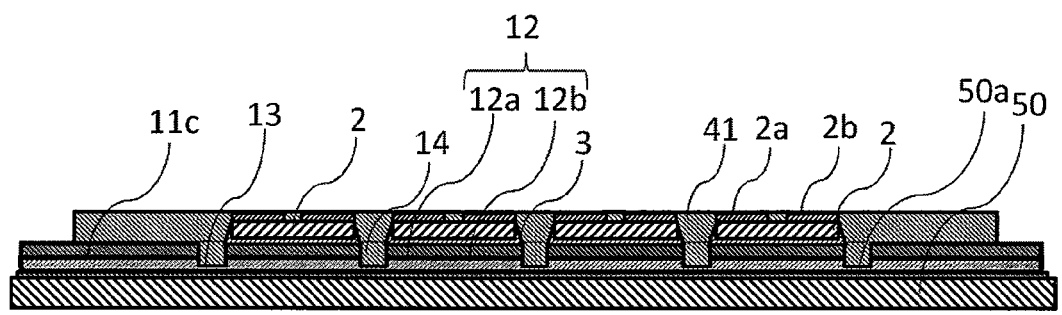
FIG. 6 is a schematic sectional view for illustrating a step in the method for manufacturing the light-emitting device according to the first embodiment.

Subsequently, the light-reflective member 4 is formed to cover the lateral surfaces of the light-emitting elements 2, the light-transmissive adhesive 3, and the lateral surfaces of the projecting portions 12 of the light-transmissive member as shown in FIG. 5 and FIG. 6. The light-reflective member 4 is preferably formed on the same supporting member 50 as that used for disposing the light-emitting elements 2 described above. This use inhibits deformation of the light-transmissive member 10 and enables the light-reflective member 4 to be precisely formed even in the case of a linear light-emitting device 100 that is narrow in the width direction. In the present embodiment, base member 41 for the light-reflective member integrally covers all of the first surfaces of the base portion 13 of a plurality of light-transmissive members bonded to the supporting member 50, the lateral surfaces of a plurality of projecting portions 12, the light-emitting elements 2 respectively disposed on the projecting portions, and the light-transmissive adhesive 3.

The light-reflective member 4 can be formed by, for example, injection molding, printing, potting, molding with a mold, such as compression molding, transfer molding. In particular, compression molding and transfer molding are most suitable because increasing the concentration of fillers contained in resin of the light-reflective member 4 reduces its fluidity.

The light-reflective member 4 may cover the lateral surfaces of one of the projecting portions 12 of the light-transmissive member, the lateral surfaces of one of the light-emitting elements 2 disposed on one of the projecting portions 12, and one of the light-transmissive adhesives 3.

The light-reflective member 4 may be formed in a plurality of installments. For example, it is possible that the base member 41 for the light-reflective member covering the lateral surfaces of the projecting portions 12 of the light-transmissive member is formed in advance before disposing the light-emitting elements 2, and the light-reflective member covering the lateral surfaces of the light-emitting elements and the light-transmissive adhesive is formed after disposing the light-emitting elements.

The light-reflective member 4 may cover the lower surfaces of the light-emitting elements 2. The light-reflective member 4 may be formed such that a pair of electrodes 2a and 2b of each of the light-emitting elements 2 are exposed. Alternatively, the light-reflective member 4 may be formed to cover the electrodes 2a and 2b as shown in FIG. 5 and then removed by, for example, grinding to expose the electrodes as shown in FIG. 6.

Figure 7:
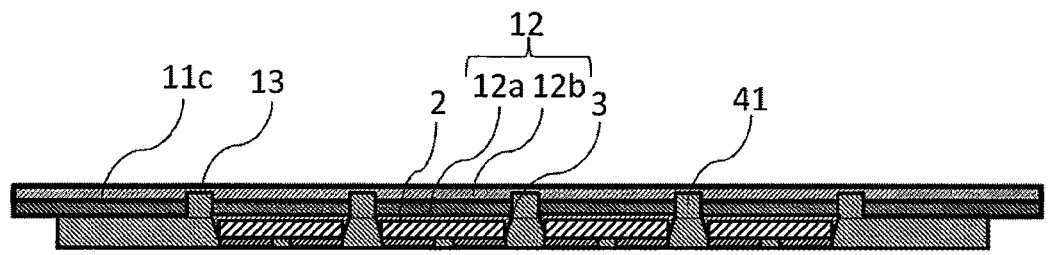
FIG. 7 is a schematic sectional view for illustrating a step in the method for manufacturing the light-emitting device according to the first embodiment.

In the present embodiment, a supporting member 15 is then removed as shown in FIG. 7.

5. Removing Base Portion of Light-Transmissive Member

Figure 8:
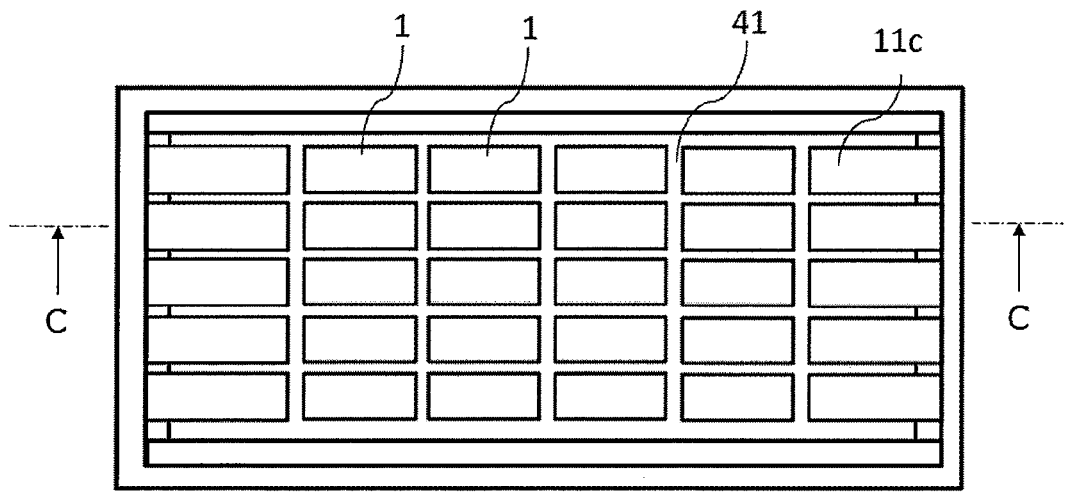
FIG. 8A is a schematic plan view for illustrating a step in the method for manufacturing the light-emitting device according to the first embodiment.
FIG. 8B is a schematic sectional view taken along the line C-C in FIG. 8A.
Figure 8:
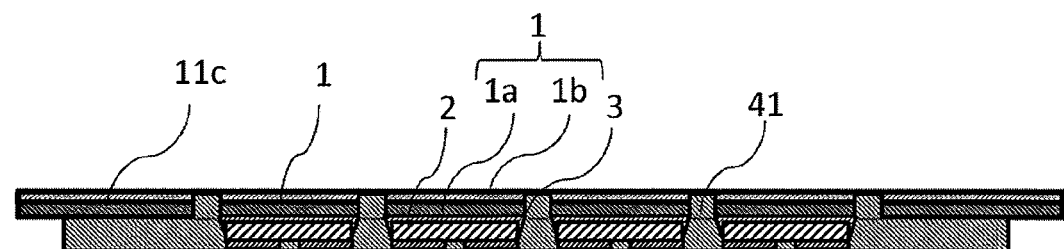

In the present embodiment, the base portion 13 of the light-transmissive member is then removed to expose the projecting portions 12 of the light-transmissive member as shown in FIG. 8A and FIG. 8B. The removal can be performed by polishing, grinding, cutting, punching (e.g., machining using Thomson blade), ultrasonic machining, laser machining, or the like. Polishing or grinding is preferable because a comparatively broad surface can be removed at a time and because a removal thickness can be precisely controlled.

Decrease in the linearity due to deformation of the light-transmissive member 10 described above hardly matters because the projecting portions 12 of the light-transmissive member are fixed with the base member 41 for the light-reflective member. Hence, moving or transferring may be performed at the time of the removal. For example, the base portion 13 can be removed after transferring to another supporting member so that the emitting surface of the light-transmissive member 10 is exposed. The light-emitting device 100 can be thus stably manufactured.

When the base portion 13 of the light-transmissive member 10 is removed, part of the projecting portions 12 of the light-transmissive member and part of the base member 41 for the light-reflective member may also be removed. This removal reduces variances in the thicknesses of the light-emitting devices and enables the light-emitting device 100 to be stably manufactured.

6. Separating Light-Emitting Device

Figure 9:
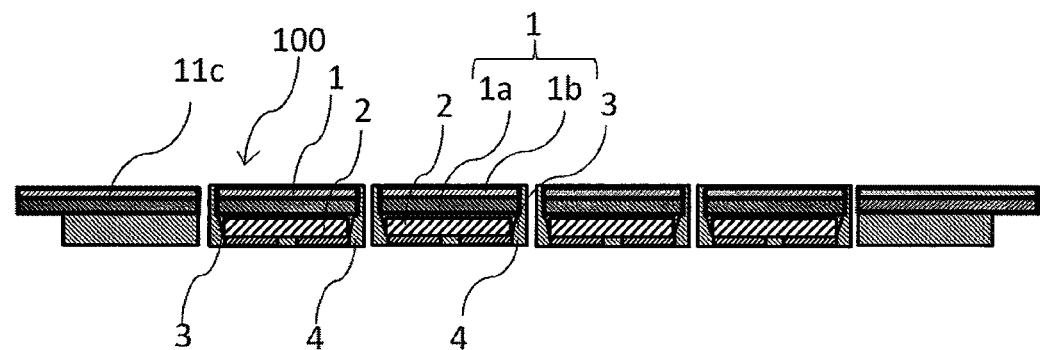
FIG. 9 is a schematic sectional view for illustrating a step in the method for manufacturing the light-emitting device according to the first embodiment.

In the present embodiment, the light-reflective member is then cut and divided along lines between the projecting portions as shown in FIG. 9 to provide a plurality of light-emitting devices 100 separated. Specifically, the base member 41 for the light-reflective member is cut, which integrally covering all of the projecting portions 12 of the light-transmissive member, the light-emitting elements 2 respectively disposed on the projecting portions 12, and the light-transmissive adhesive 3. This cutting can be performed by dicing, punching (e.g., machining using Thomson blade), ultrasonic machining, laser machining, or the like.

In the separating, each projecting portion 12 of the light-transmissive member may be cut along its width direction (i.e., a direction intersecting with the longitudinal direction). Accordingly, light-emitting devices 100 having various lengths can be manufactured.

The light-emitting devices 100 involved in the present embodiment can be thus obtained.

Variation of First Embodiment (Herein after Referred to Variation 1)

The light-emitting device 100 according to the first embodiment has a structure in which of the single light-emitting element 2 is disposed on the single protruding portion 12, however, a light-emitting device 100a according to Variation 1 has a structure in which a plurality of light-emitting elements 2 are disposed on single protruding portion 12. A light-emitting device 100a according to Variation 1 of the first embodiment is described below. A method for manufacturing the light-emitting device in which two of the light-emitting elements 2 are disposed on the single protrusion portion 12 are described below, with reference to FIGS. 17A through 17F. The case where more than two of the light-emitting elements 2 are disposed on the single protruding portion 12 are also described with reference to FIG. 13A through 13E, as necessary.

Figure 17A:
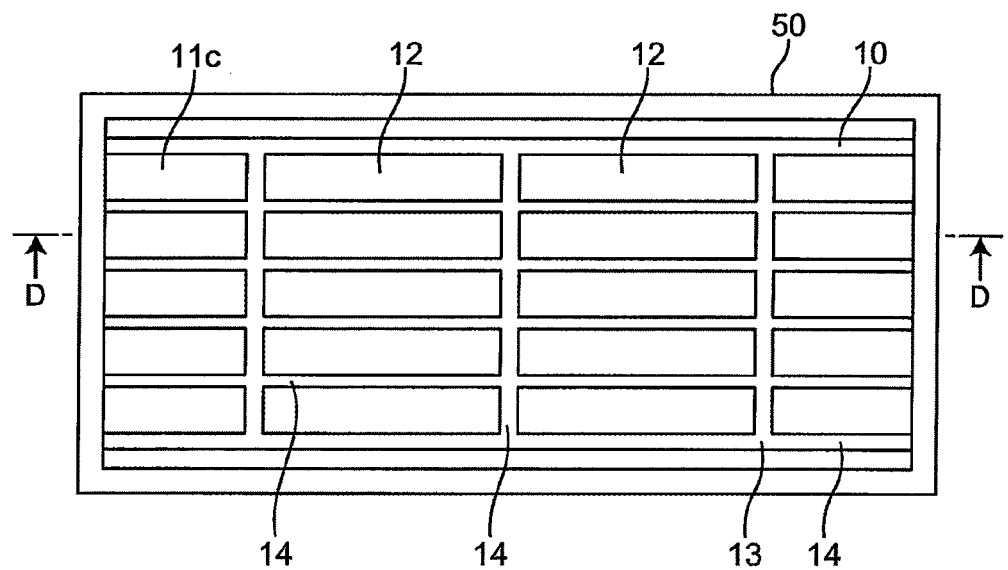
FIG. 17A is a schematic sectional view for illustrating a step in the method for manufacturing a light-emitting device according to Variation 1.
Figure 17B:
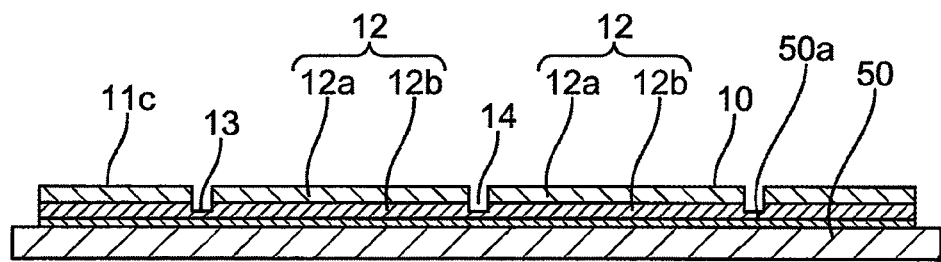
FIG. 17B is a schematic sectional view taken along the line D-D in FIG. 17A.
Figure 17C:
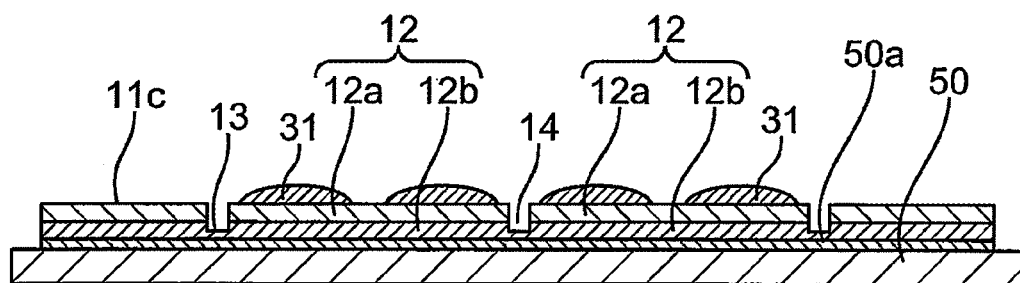
FIG. 17C is a schematic sectional view for illustrating a step in the method for manufacturing the light-emitting device according to Variation 1.

In the manufacturing method in Variation 1, the base member 11 of the light-transmissive member which is formed in a sheet shape, is disposed on the supporting member 50 in the same or similar manner as the first embodiment, as shown in FIGS. 1A and 1B. The plurality of protruding portion 12 are formed by creating the plurality of grooves 14 formed on the base member 11 in the same or similar manner as the first embodiment, as shown in FIGS. 17A and 18B. In Variation 1, the protruding portions 12 are each formed in such a manner as to be approximately twice the length of one of the protruding portions 12 in the longitudinal direction of the first embodiment as shown in, for example, FIG. 17A.

The protruding portions 12 are formed in matrix of 2 rows×5 columns in Variation 1 as shown in FIG. 17. In the area around the protruding portions 12 formed in the 2 rows×5 columns matrix, remaining portions 11c are located in the same or similar manner as the first embodiment. Regions of the base portion 13 respectively connect between the protruding portions 12 and the remaining portions 11c.

The protruding portion 12 in the longitudinal direction in Variation 1 has a length longer than the length of the protruding portion 12 in the longitudinal direction in the first embodiment, whereas the grooves 14 for defining the protruding portions 12 are preferably formed by dicing due to its good straightness. In the case where more than two of the light-emitting elements 2 are disposed on each of the protruding portions 12, good straightness is especially needed, as shown in FIGS. 13A through 13E. Forming the grooves with good straightness can realize thin light-emitting devices in which each of light emission surfaces is long in the longitudinal direction (i.e., L4 shown in 13C) as shown in FIGS. 13A through 13E.

For a light-emitting device in which the light emitting surface has a length several times as much (i.e., multiplication of an integer greater than 2) the length of the emitting surface of the light-emitting element in the longitudinal direction, as shown in FIGS. 13A through 13E or the like, the thickness of the light-reflective member 4 is preferably thinned as much as possible while maintaining the needed minimum thickness. Specifically, the light-reflective member 4 is preferably formed over the entire lateral surfaces of the light-emitting device 100 in a thickness of about 10 μm to about 100 μm, more preferably about 20 μm to about 50 μm. In the case of manufacturing a light-emitting device in which a emitting surface is long in the longitudinal direction as shown in FIGS. 13A through 13E, the grooves 14 each having a band shape which has longer sides in one direction by forming the grooves 14 in only one direction to define the protruding portions 12.

Liquid resin material which is used to fix the light-emitting elements 2 to predetermined positions, is applied. In Variation 1, the liquid resin material 31 is applied at two separated position in the longitudinal direction on the surface of each of the protruding portions 12, as shown in, for example, FIG. 17C.

Figure 13B:
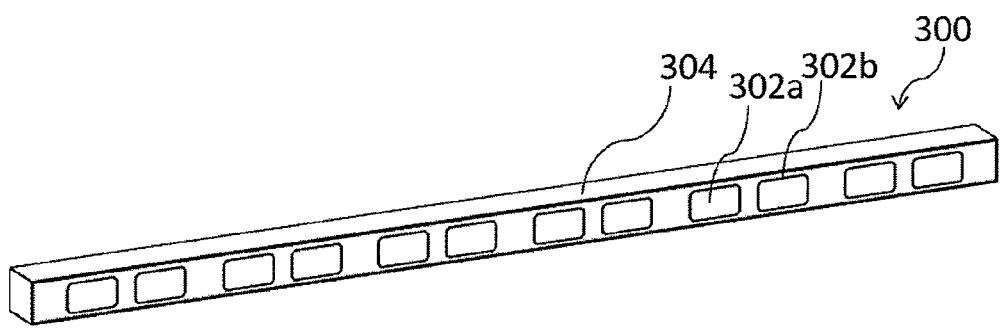
FIG. 13B is a schematic perspective view of the light-emitting device according to Example 3.
Figure 13C:
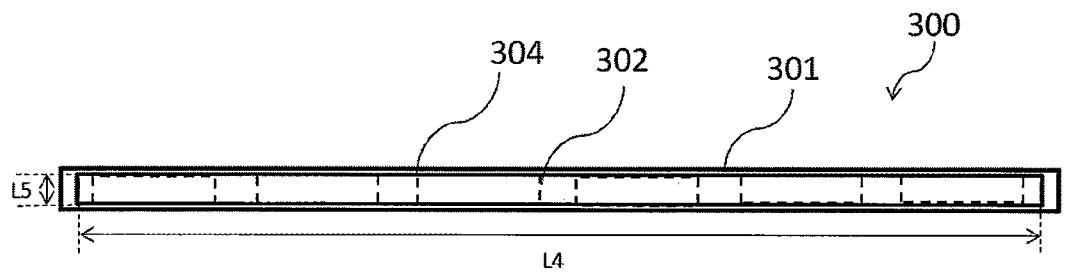
FIG. 13C is a schematic plan view of the light-emitting device according to Example 3.
Figure 13D:
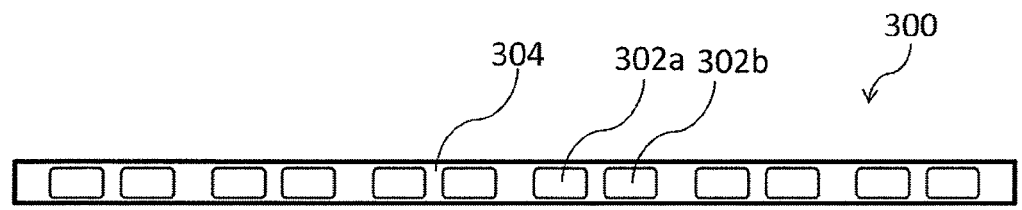
FIG. 13D is a schematic bottom view of the light-emitting device according to Example 3.
Figure 13E:
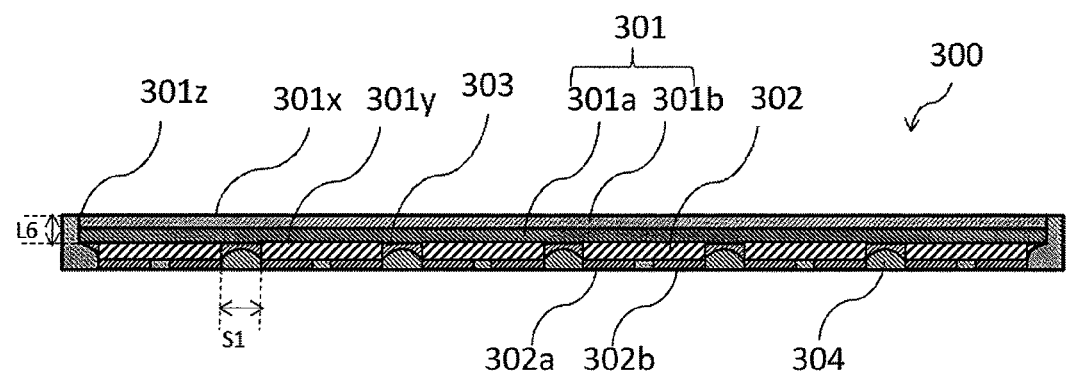
FIG. 13E is a schematic sectional view of the light-emitting device according to Example 3.

In the light-emitting device 100a according to Variation 1, preferably, light-transmissive adhesives 3 respectively exists between the plurality of adjacent light-emitting elements 2 in a continuous manner, as shown in FIG. 13E. After disposing the light-emitting elements in this manner, the liquid resin material 31 can be applied at separated several portions in the longitudinal direction, in order to allow the light-transmissive adhesives 3 to achieve connection between the latera surfaces of the adjacent light-emitting elements 2. In such a case, the amount of the liquid resin material applied is adjusted such that overrun of the light-transmissive adhesives 3 between the lateral surfaces of the adjacent light-emitting elements 2 connect each other by disposing and pressurizing the light-emitting elements 2. Instead of separately forming the liquid resin material 31 on several positions of each of the protruding portions 12, the liquid resin material 31 may be continuously disposed in the longitudinal direction, and light-emitting elements 2 may be disposed on the continuously disposed liquid resin material 31 at the predetermined intervals. With the structure that the lateral surfaces of the adjacent light-emitting elements 2 are connected with the light-transmissive adhesive 3, light emitted from the light-emitting elements 2 can be uniform inside the light-transmissive adhesive 3. Hence, non-uniformity of the light form the light-emitting elements 2 can be mitigated.

Figure 16A:
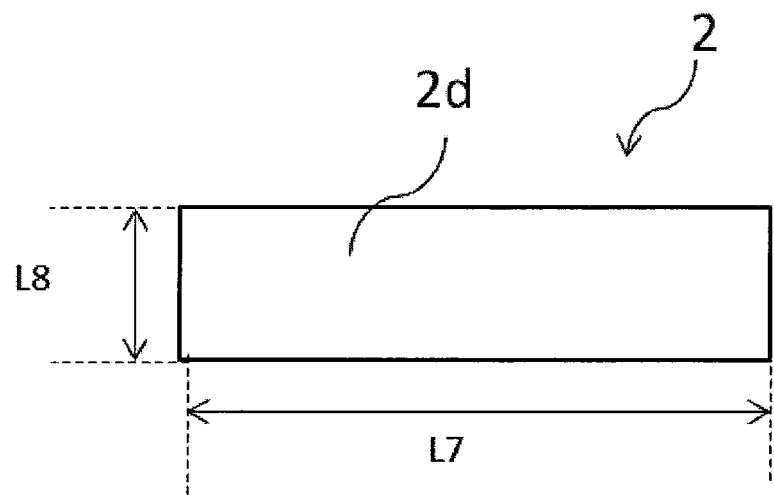
FIG. 16A is a schematic plan view of a light-emitting element according to the embodiments.
Figure 16B:
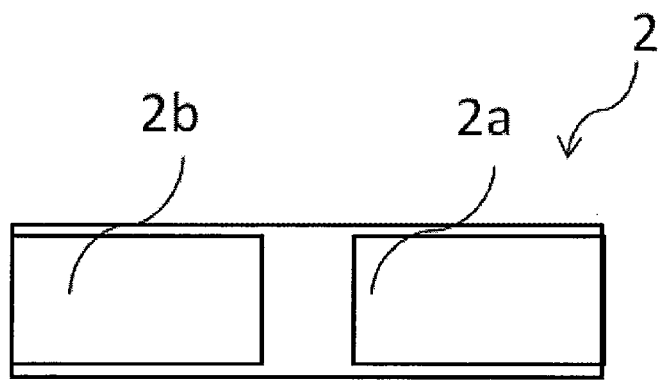
FIG. 16B is a schematic bottom view of the light-emitting element according to the embodiments.
Figure 17D:
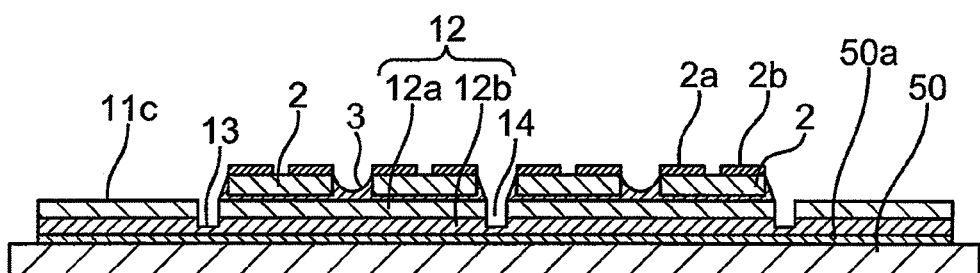
FIG. 17D is a schematic sectional view for illustrating a step in the method for manufacturing the light-emitting device according to Variation 1.

The light-emitting elements 2 are disposed on the liquid resin material 31 as shown in FIG. 17D. The light-emitting elements 2 are disposed such that the main emitting surface thereof face the light-transmissive member. In this course, the center line of the sides of the light-emitting elements in the longitudinal direction coincide with the center line of the sides of the protruding portions of the light-transmissive member in the longitudinal direction. In the case where a plurality of light-emitting elements 2 are used, the intervals between the light-emitting elements can be about 10 μm to about 1,000 μm, preferably, for example, 200 μm to 800 μm, more preferably about 500 μm. Also, the intervals are preferably about 0.5 times to about 1 time a length L7 in the longitudinal direction of the light-emitting element 2 shown in FIG. 16A. Setting intervals 51 between the light-emitting elements to about 0.5 times to about 1 time the length L7 in the longitudinal direction of the light-emitting element as described above can reduce the number of the light-emitting elements 2 mounted in one light-emitting device 100. This reduction facilitates manufacture of a long light-emitting device as shown in FIG. 13A through FIG. 13E and cuts the cost of materials.

Figure 17E:
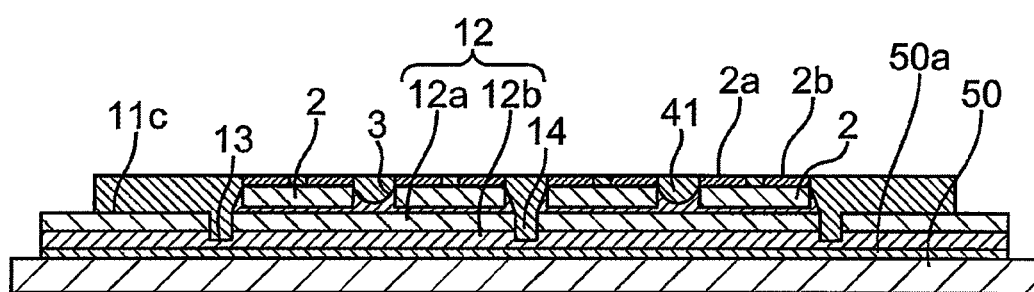
FIG. 17E is a schematic sectional view for illustrating a step in the method for manufacturing the light-emitting device according to Variation 1.
Figure 17F:
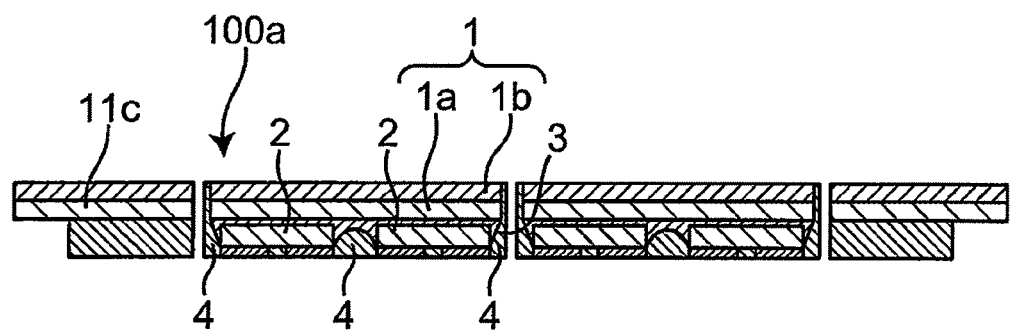
FIG. 17F is a schematic sectional view for illustrating a step in the method for manufacturing the light-emitting device according to Variation 1.

The liquid resin material is cured, and thereafter, the light-reflective member is formed. In Variation 1, base members 41 of the light-reflective members are formed in the grooves 14, and formed between the adjacent light-emitting elements 2 on the protruding portions 12, as shown in FIG. 17E. The base members 41 of light-reflective member are formed in such a manner as to cover the lateral surfaces between the adjacent light-emitting elements 2 and the light-transmissive adhesive 3 both disposed on each of the protruding portions 12. The base member 41 of the light-reflective member are also formed in the grooves 14 in such a manner as to cover the lateral surfaces of the protruding portions 12 in addition to the lateral surfaces of the light-emitting elements 2 and the light-transmissive adhesive 3.

In FIG. 17E, the base member 41 of the light-reflective member formed such that each of pairs of electrodes 2a and 2b of the light-emitting elements 2 is exposed. The base member 41 of light-reflective member may, however, embed the electrodes 2a and 2b, thereafter, may be ground to expose the electrodes 2a and 2b, in the same or similar manner as the first embodiment.

Also in the same or similar manner as the first embodiment, the base member of the light-transmissive member is removed after removing the supporting member to separate into the individual light-emitting devices. The separation may be performed by cutting the light-reflective member positioned in the grooves 14 along the center lines of the grooves 14, as shown in FIG. 17. In the above description, the light-reflective member before the separation is referred to as the "base member 41 of the light-reflective member", and the light-reflective member after the separation is referred to as the "light-reflective member 4" accompanying the reference numeral of 4.

As such, the light-emitting devices 100a according to Variation 1 in which the plurality of light-emitting elements 2 are disposed on the single protruding portions 12, are manufactured.

Second Embodiment

Figure 11A:
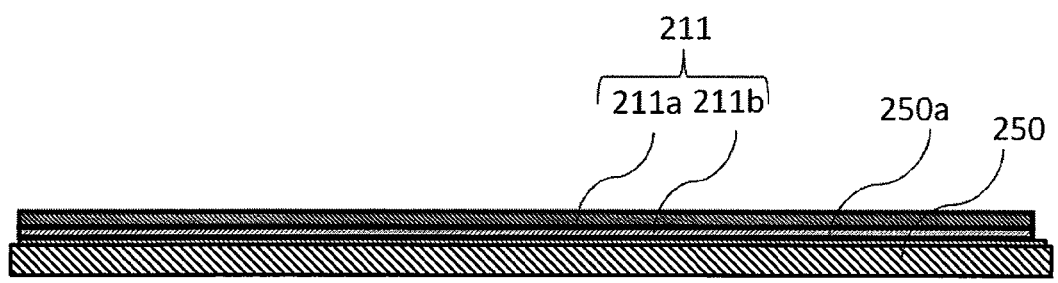
FIG. 11A is a schematic sectional view for illustrating a step in a method for manufacturing a light-emitting device according to a second embodiment.
Figure 11B:
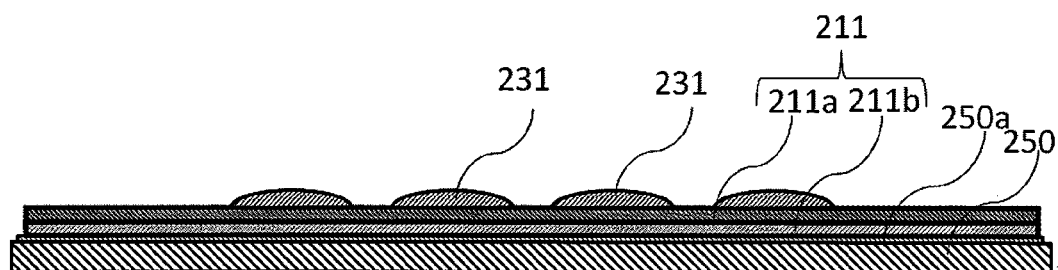
FIG. 11B is a schematic sectional view for illustrating a step in the method for manufacturing the light-emitting device according to the second embodiment.
Figure 11C:
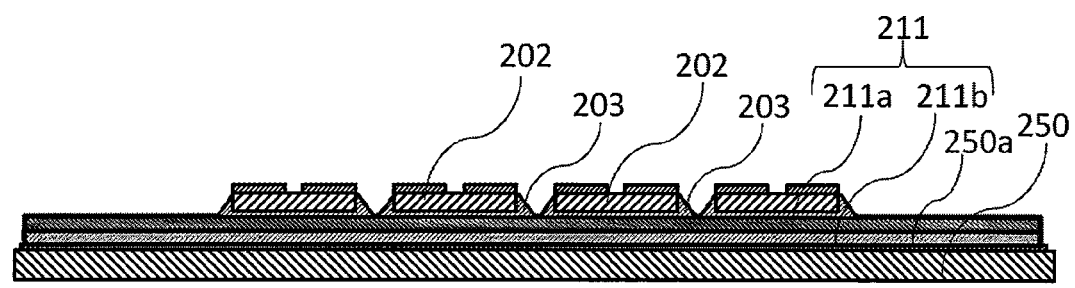
FIG. 11C is a schematic sectional view for illustrating a step in the method for manufacturing the light-emitting device according to the second embodiment.
Figure 11D:
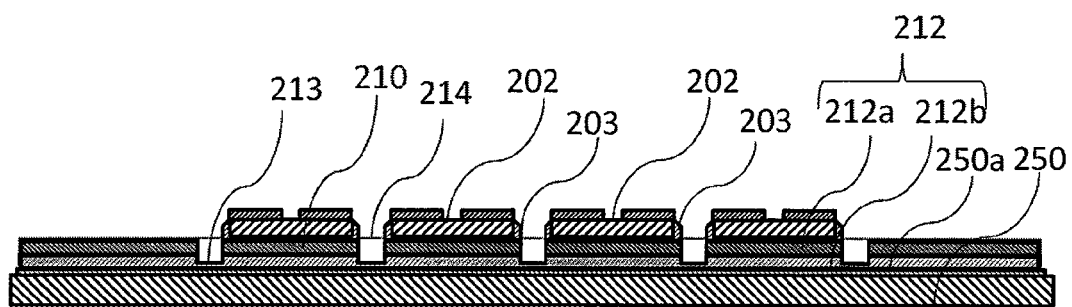
FIG. 11D is a schematic sectional view for illustrating a step in the method for manufacturing the light-emitting device according to the second embodiment.
Figure 12A:
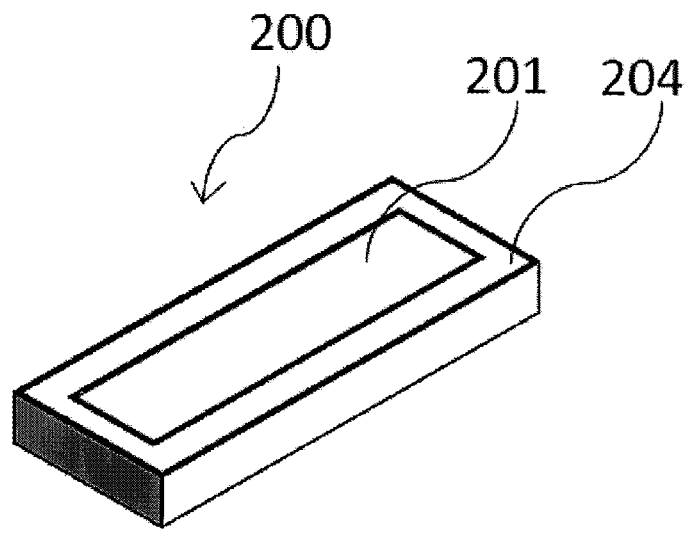
FIG. 12A is a schematic perspective view of the light-emitting device according to the second embodiment.

In the present embodiment, light-emitting elements 202 are disposed on a base member 211 for a light-transmissive member as shown in FIG. 11A, FIG. 11B, and FIG. 11C, and then part of the base member 211 for the light-transmissive member is removed such that depressed portions 214 are formed around the light-emitting elements 2 as shown in FIG. 11D to form projecting portions 212. A slim light-emitting device 200 as shown in FIG. 12A and FIG. 12B can be manufactured also with a light-transmissive member 210 formed in this manner. The other steps can be performed in the manner the same as or similar to in the first embodiment. The depressed portions 214 can be formed in substantially the same or similar manner as the forming of the projecting portions 12 in the first embodiment. In the forming of the depressed portions 214, part of the edge portions of a light-transmissive adhesive 213 which bonds the light-emitting elements 202 to the base member 211 for the light-transmissive member, may be removed. Accordingly, the small and slim light-emitting device 200 can be manufactured.

Variation of Second Embodiment (Herein after Referred to as Variation 2)

Figure 18:
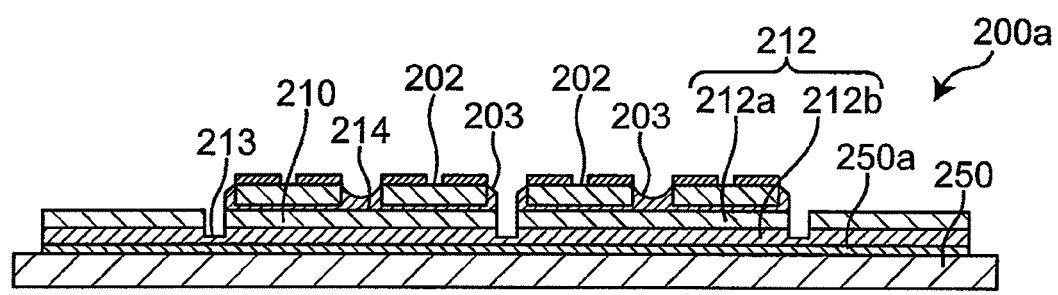
FIG. 18 is a schematic sectional view for illustrating a step in the method for manufacturing the light-emitting device according to Variation 2.

In the light-emitting device 200 of the second embodiment, the single light-emitting elements 202 is disposed on the single protruding portion 212. In a light-emitting device 200a of Variation 2, however, a plurality of light-emitting elements 202 are disposed on a single protruding portion 212. Specifically, in the light-emitting device 200a of Variation 2, the depressed portions 214 are formed in such a manner as to include the plurality of light-emitting elements 202 on the single protruding portion 212 (2 light emitting elements in FIG. 18), as shown in FIG. 18. Other than the position formed the depressed portions 214, the light-emitting devices 200a of Variation 2 are manufactured in the same or similar manner as to the second embodiment.

Materials suitable for constituent members of the light-emitting devices 100 and 200 in the embodiments are described below.

Light-Transmissive Members 10 and 210

Figure 14:
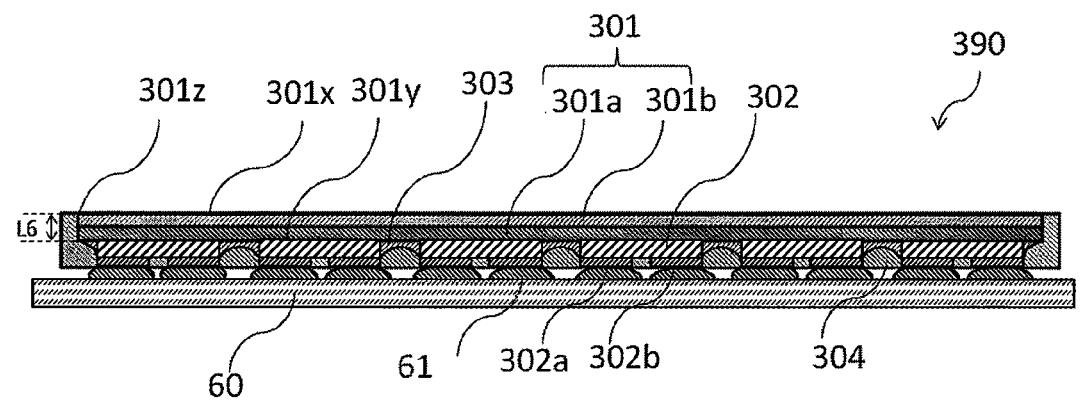
FIG. 14 is a schematic sectional view of a lighting apparatus employing the light-emitting device according to Example 3.

A light-transmissive resin, glass, or the like can be used as the base material of the light-transmissive member 10 or 210. A very narrow and long light-emitting device 300 as shown in FIG. 13A to FIG. 13E may have very low strength against bending stress in the manufacturing process of the light-emitting device and in the assembly process of a lighting apparatus (for example, a backlight apparatus 390 as shown in FIG. 14) employing the light-emitting device. Hence, in the case where a fragile light-transmissive member composed of an inorganic substance, such as glass, is used, the light-transmissive member may be easily damaged by the force applied to a light-transmissive member 1 in the manufacturing process of the light-emitting device 300. To inhibit or prevent this damage, an organic substance, particularly a somewhat pliable or flexible resin, is preferably used as the base material.

Examples of the resin include silicone resins, modified silicone resins, metamorphic silicone resins, epoxy resins, phenolic resins, polycarbonate resins, acrylic resins, TPX, polynorbornene resins, and hybrid resins each containing one or more of the above-mentioned resins. Silicone resins and epoxy resins are preferable among these resins, and particularly, silicone resins is preferable due to their good resistance to light and heat.

Using glass or a sintered body of a phosphor as the light-transmissive member can reduce deterioration of the light-transmissive member, thereby enabling enhancement of reliability of the light-emitting device. Such a light-emitting device can be suitably used for, for example, a light source for a headlight for a vehicle.

The light-transmissive member preferably contains at least one phosphor. This structure enables light-emitting devices that emit various colors of light, particularly white light, through wavelength conversion of light emitted from light-emitting elements to be provided. Phosphors known in the art can be used. Examples of the phosphors include cerium-activated yttrium-aluminum-garnet (YAG) based phosphors, cerium-activated lutetium-aluminum-garnet (LAG) based phosphors, europium- and/or chromium-activated nitrogen-containing calcium aluminosilicate (CaO—$Al_2O_3$—$SiO_2$) based phosphors, europium-activated silicate (($Sr,Ba)_2SiO_4$) based phosphors, β-SiAlON phosphors, KSF based phosphors ($K_2SiF_6$:Mn), and semiconductor particles called quantum-dot phosphors. This can realize a light-emitting device that emits mixed light (e.g., white light) of primary light and secondary light having visible wavelengths, or a light-emitting device that emits visible secondary light through excitation by ultraviolet primary light. In the case where the light-emitting device is used for a backlight for a liquid-crystal display, it is preferable to use a phosphor (e.g., a KSF based phosphor) that emits red light and a phosphor (e.g., a β-SiAlON phosphor) that emits green light through excitation by blue light emitted from the light-emitting elements. This structure expands the color reproduction range of a display employing the light-emitting device 100. In the case where the light-transmissive member contains a phosphor that is vulnerable to moisture or external environments, a layer free of phosphors can be positioned more closely to the emitting surface than a portion containing a the phosphor that is vulnerable to moisture or external environment, thereby enabling protection of the phosphor that is vulnerable to moisture or the like. Example of the phosphor that is vulnerable to moisture or external environment is KSF based phosphor.

The location of the phosphor is not limited to the inside of the light-transmissive member 10 or 210, and the phosphor may be located in various positions or members in the light-emitting device. For example, a phosphor layer may be applied or bonded to a phosphor-free layer that contains substantially no phosphor particles in the light-transmissive member 10 or 210. The phosphor can be contained in the light-transmissive adhesive 3.

The light-transmissive member 10 or 210 may further contain a filler, such as diffusing agents and colorants. Examples of the filler include silica, titanium oxide, zirconium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass, carbon black, crystals and sintered bodies of phosphors, and sintered bodies of mixtures of phosphors and inorganic binders. The refractive index of the filler may be optionally adjusted. The refractive index is, for example, 1.8 or more, preferably 2 or more to efficiently scatter light and provide high light extraction efficiency, more preferably 2.5 or more. Among these materials, titanium oxide is preferable because it is comparatively stable against moisture and the like, and has a high refractive index and a good thermal conductivity. Particles of the filler can be crushed, spherical, hollow, or porous shape. The average particle diameter (i.e., median particle diameter) is preferably about 0.08 μm to about 10 μm to provide efficient light-scattering effects. The amount of the filler is preferably, for example, about 10 wt % to about 60 wt % of the weight of the light-transmissive member 10.

The light-transmissive member 10 or 210 includes the base portion 13 or 213 of the light-transmissive member and the projecting portions 12 or 212 of the light-transmissive member.

The size of the base member 11 for the light-transmissive member can be determined appropriately depending on manufacturing apparatuses and the size of the projecting portions 12 or 212 of the light-transmissive member.

The size of the projecting portions 212 of the light-transmissive member can be determined appropriately depending on the size of the light-emitting device 100 or 200.

For example, the length L4 in the longitudinal direction indicated in FIG. 13C can be about 1 time to 1,000 times, 50 times to 500 times, or 100 times to 450 times the length L5 in the width direction. By the method for manufacturing a light-emitting device in the present embodiment, the manufacture is easily performed even in the case where such a light-transmissive member having a length in the longitudinal direction much longer than its length in the width direction is used. Also, using a light-emitting device having such a narrow emitting surface facilitates manufacture of a lighting apparatus (e.g., backlight apparatus) compared with the case where a lot of light-emitting devices are disposed.

Specifically, the length L4 in the longitudinal direction indicated in FIG. 13C can be about 2.5 cm to about 13.6 cm or about 4 cm to about 10 cm. It is thus sufficient for a backlight apparatus to include only one light-emitting device disposed, so that disposing of the light-emitting device and manufacture of the backlight apparatus are easily performed.

Specifically, the length L5 in the width direction indicated in FIG. 13C can be about 200 µm to about 400 µm, more preferably about 200 µm to about 300 µm. The slim light-emitting device 100 or about 200 is thus manufactured.

The thickness of the light-transmissive member 10 or 210 affects the height of the light-emitting device (i.e., L3 in FIG. 13A), but reducing the thickness increases the probability of breakage and limits the amount of phosphors contained. Hence, the thickness is selected appropriately. The thickness is preferably about 10 µm to about 300 µm, more preferably about 30 µm to about 200 µm.

The light-transmissive encapsulating member 1 or 201 or the base member 11 or 211 for the light-transmissive member may be a single layer or may have a layered structure configured with a plurality of layers as appropriate as shown in, for example, FIG. 2B. For example, a second layer that is a phosphor-free layer 11b or 211b containing substantially no phosphor particles may be disposed on a first layer 11a or 211a that is a phosphor-containing layer. Alternatively, a plurality of layers containing different types of phosphors may be layered. For example, a first layer containing a first phosphor that emits green light and a second layer containing a second phosphor that emits red light are formed separately and joined to provide a two-layered base member 11 for the light-transmissive member. Alternatively, the two-layered base member 11 for the light-transmissive member can be provided by spraying or the like, by forming the first layer and then forming the second layer on the first layer. Also, a phosphor-containing portion containing at least one type of phosphor and a phosphor-free portion containing substantially no phosphor particles may be layered as shown in FIG. 1B. Such a light-transmissive member can be formed by, for example, joining a plurality of sheets formed separately. A three-layered light-transmissive member may be formed by joining two phosphor layers each containing phosphor different from each other and a layer, which is the phosphor-free portion, containing substantially no phosphor particles.

In the case where the phosphor used in the light-emitting device easily degrades due to effects of environments such as moisture, the phosphor-free portion containing substantially no phosphor particles is preferably disposed on the light-extracting surface side of the phosphor-containing portion of the light-transmissive encapsulating member 1. This structure can reduce a probability that the outside air is in contact to the phosphor, thereby inhibiting degradation of the phosphor. Also, a layer containing a filler, such as diffusing agents and colorants, may be disposed on a portion on the light-extracting surface side of the light-transmissive encapsulating member. Disposing such a layer containing a filler can improve color non-uniformity and weaken the adhesiveness of the light-emitting device. In the case of using a filler having a higher thermal conductivity than the base material of the light-transmissive encapsulating member, the thermal conductivity of the light-emitting device is improved, thereby increasing the reliability thereof.

Examples of the filler include silica, titanium oxide, zirconium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass, carbon black, crystals and sintered bodies of phosphors, and sintered bodies of mixtures of phosphors and inorganic binders. A material having a high refractive index is preferably selected for the filler. The refractive index is, for example, 1.8 or more, preferably 2 or more in order to efficiently scatter light and provide high light extraction efficiency, more preferably 2.5 or more. Among these materials titanium, oxide is particularly preferable because it is comparatively stable against moisture and the like and has a high refractive index and a good thermal conductivity. The filler particles can be crushed, spherical, hollow, or porous shape. The average diameter (i.e., median diameter) of the particles is preferably about 0.08 µm to about 10 µm to provide highly efficient light-scattering effects. The amount of the filler is preferably, for example, about 10 wt % to about 60 wt % of the weight of the light-transmissive member.

In the case where the light-transmissive member 10 or 210 is formed of a liquid material containing a liquid resin and phosphor particles, the light-transmissive member 10 or 210 is preferably mixed with fine particles of at least one filler such as Aerosil. This structure imparts a thixotropic property to the material for the light-transmissive member 10 or 210 to inhibit settling of the phosphor particles, so that the base member 11 for the light-transmissive member in which the phosphor particles are uniformly dispersed is formed.

Light-Emitting Elements 2 and 202

The light-emitting elements 2 or 202 are disposed on the projecting portions 1 of the light-transmissive member.

The light-emitting elements 2 or 202 each have the main emitting surface and the electrode formation surface opposite to the main emitting surface.

The size, shape, and emission wavelength of the light-emitting elements 2 or 202 can be appropriately selected. In the case where a plurality of light-emitting elements 2 are incorporated in one light-emitting device 100 or 200, their arrangement may be irregular or may be regular, such as a matrix. To reduce non-uniformity in emission intensity and color, the light-emitting elements are preferably arranged regularly at substantially equal intervals as shown in FIG. 13E.

In the case where a plurality of light-emitting elements 302 are disposed in one light-emitting device 300, their connection may be any of series, parallel, series-parallel, or parallel-series connections. The light-emitting device may be manufactured such that a plurality of light-emitting elements 2 are electrically separated as shown in FIG. 13B, and then electrically connected via a mounting board 60 on which the light-emitting device 300 is disposed. The light-emitting elements 302 can be connected in series by disposing an electrically-conductive metal film on the surface of the light-reflective member to connect positive and negative electrodes 302a and 302b of respective light-emitting elements 302.

The length L7, the longitudinal direction side of the light-emitting element, shown in FIG. 16A can be, for example, about 200 µm to about 1,500 µm. The length L7 is preferably about 500 µm to about 1,200 µm, more preferably about 700 µm to about 1,100 µm.

The length L8, the width direction side of the light-emitting element 2, shown in FIG. 16A can be, for example, about 50 µm to about 400 µm. The length L8 is preferably about 100 µm to about 300 µm. This structure enables the light-emitting element to be disposed in the slim light-emitting device 100.

By using light-emitting elements 2 each having a length L7 in the longitudinal direction about three times, preferably five times or more, the length L8 in the width direction, increase in the number of the light-emitting elements 2 used can be inhibit, and facilitates manufacture, even in the case where a light-emitting device 100 having a long length L1 in the longitudinal direction is manufactured. Using light-emitting elements 2 each having a length L7 in the longitudinal direction about three to six times the length L8 in the width direction reduces a possibility of breakage of the light-emitting elements 2 during manufacture, thereby facilitating manufacture of the light-emitting device 100.

Figure 16C:
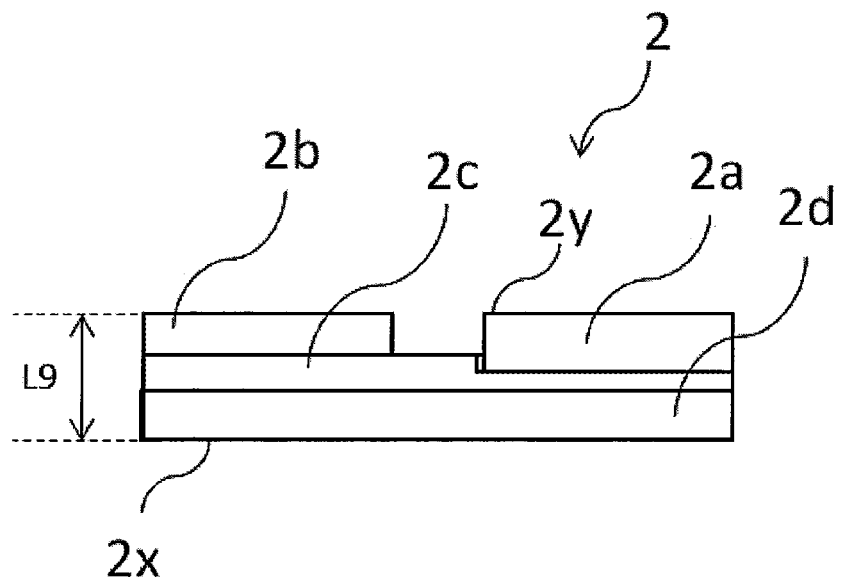
FIG. 16C is a schematic sectional view of the light-emitting element according to the embodiments.

A thickness L9 of the light-emitting element 2 indicated in FIG. 16C is preferably, for example, about 80 µm to about 200 µm. This structure allows the width of a frame of a backlight apparatus to be reduced in the case where, for example, the light-emitting device 100 is incorporated into the backlight apparatus such that the end surface of a light-guiding plate from which light is incident, is parallel to the emitting surface.

As shown in FIG. 16C, the light-emitting element 2 used in the light-emitting device 100 includes a semiconductor layered body 2c including a first semiconductor layer (e.g., an n-type semiconductor layer), a light-emitting layer, and a second semiconductor layer (e.g., a p-type semiconductor layer) layered in this order. The light-emitting element 2 also includes the first electrode 2a electrically connected to the first semiconductor layer, and the second electrode 2b electrically connected to the second semiconductor layer, both on the same surface that is the lower surface (e.g., the surface close to the second semiconductor layer). The semiconductor layered body 2c is usually layered on a substrate 2d, but it does not matter whether the light-emitting element 2 includes the substrate 2d or not.

The types and materials of the first semiconductor layer, the light-emitting layer, and the second semiconductor layer are not limited to particular types or materials, and their examples include various semiconductors such as group III-V compound semiconductors and group II-VI compound semiconductors. Specific examples include nitride semiconductor materials represented by $In_XAl_YGa_{1-X-Y}N$ ($0 \leq X$, $0 \leq Y$, $X+Y \leq 1$), such as InN, AlN, GaN, InGaN, AlGaN, and InGaAlN. Each layer can employ a thickness and layer structure known in the art.

Examples of the substrate 2d include growth substrates on which semiconductor layers can be epitaxially grown. Examples of the material for such a substrate 2d include insulating substrates, such as sapphire ($Al_2O_3$) and spinel ($MgAl_2O_4$) substrates, and the above-mentioned nitride-based semiconductor substrates. In the case where a light-transmissive substrate 2d, such as a sapphire substrate, is used as the growth substrate for the semiconductor layers, the substrate 2d can be used in the light-emitting device without being removed from the semiconductor layered body.

The substrate 2d may have a plurality of projecting portions or irregularities on its surface. The substrate 2d may have an off angle of about 0 to 10° to a predetermined crystal plane, such as the C-plane and the A-plane.

A semiconductor layer such as an intermediate layer, a buffer layer, and an underlying layer or an insulating layer may be disposed between the substrate 2d and the first semiconductor layer.

The shape of the semiconductor layered body 2c in a plan view is not limited to particular shapes and is preferably a quadrilateral or a shape similar to a quadrilateral. The size of the semiconductor layered body 2c in a plan view can be adjusted appropriately depending on the size of the light-emitting element 2 in a plan view.

First Electrodes 2a and 202a and Second Electrodes 2b and 202b

The first electrode 2a and the second electrode 2b are disposed on a lower surface 2y side of the light-emitting element 2. The first and second electrodes 2a and 2b are formed preferably on the same surface of the semiconductor layered body 2c, in the case where the substrate 2d exists, on the surface opposite to the substrate 2d. This structure enables flip-chip mounting, in which positive and negative connection terminals of the mounting board 60 are bonded to the first electrode 2a and the second electrode 2b of the light-emitting element 2 such that the terminals face the electrodes.

The first electrode 2a and the second electrode 2b can be formed of, for example, single-layer films or multi-layer films composed of metals, such as Au, Pt, Pd, Rh, Ni, W, Mo, Cr, and Ti, or their alloys. Specific examples include layered films including layers in certain orders, such as Ti/Rh/Au, W/Pt/Au, Rh/Pt/Au, W/Pt/Au, Ni/Pt/Au, and Ti/Rh in the order from the semiconductor layer side. Any thickness of a film used in the art may be employed.

In layers of the first electrode 2a and the second electrode 2b, a layer formed with a material having higher reflectance with respect to light emitted from the light emitting layer than reflectance of the other layers therein is preferably disposed near side of the first semiconductor layer and the second semiconductor layer.

Examples of the material that has a higher reflectance include layers containing silver, silver alloys, or aluminum. Silver alloys known in the art may be used. The thickness of each material layer is not limited to particular values. A thickness large enough to effectively reflect light emitted from the light-emitting element 2 may be employed, which is, for example, about 20 nm to about 1 µm. It is more preferable to have a larger contact area between the material layer and the first or second semiconductor layer.

In the case where silver or a silver alloy is used, a cover layer that covers surface thereof (preferably the upper surface and end surfaces) is preferably formed to inhibit or prevent silver migration. For such a cover layer, a layer composed of a metal or an alloy commonly used as an electrically conductive material may be used. Examples of the layer include single layers and multi-layered layers containing metals such as aluminum, copper, and nickel. AlCu is preferable among such metals. The thickness of the cover layer is, for example, about some hundreds of nanometers to some micrometers to effectively inhibit or prevent silver migration.

As long as the first electrode 2a and the second electrode 2b are electrically connected respectively to the first semiconductor layer and the second semiconductor layer, the surfaces of the electrodes may not entirely have contact with the semiconductor layers.

Also, part of the first electrode 2a may not be located on/above the first semiconductor layer, and/or part of the second electrode 2b may not be located on/above the second semiconductor layer. That is, for example, the first electrode 2a may be disposed on the second semiconductor layer via an insulating film or the like disposed therebetween, or the second electrode 2b may be disposed on the first semiconductor layer via an insulating film or the like disposed therebetween. This structure enables the shape of the first electrode 2a or the second electrode 2b to be easily changed, thereby facilitating mounting of the light-emitting device 100 or 200.

The insulating film here is not limited to particular films and may be any single-layer film or multi-layer film used in the art. Using the insulating film or the like allows the first electrode 2a and the second electrode 2b to have optional sizes and to be located at optional positions regardless of the plane area(s) of the first semiconductor layer and/or the second semiconductor layer.

In this case, the first electrode 2a and the second electrode 2b preferably have substantially the same planar shape of at least the surfaces to be contact to the mounting board 60. The first electrode 2a and the second electrode 2b preferably face each other across the central portion of the semiconductor layered body 2c as shown in FIG. 13B.

First main surfaces of the first electrode 2a and the second electrode b (i.e., surfaces opposite to the semiconductor layer) may have a height difference but are preferably substantially flat. The term "flat" here means that the height from a second main surface of the semiconductor layered body 2c (i.e., surface opposite to a first main surface) to the first main surface of the first electrode 2a is substantially the same as the height from the second main surface of the semiconductor layered body 2c to the first main surface of the second electrode 2b. The term "substantially the same" here means that about ±10% tolerance of the height of the semiconductor layered body 2c are acceptable.

With the first surfaces of the first electrode 2a and the second electrode 2b whose first surfaces are substantially flat as described above, that is, whose first surfaces are in substantially the same plane, bonding of the light-emitting device to the mounting board 60 or the like can be readily performed as shown in FIG. 14. The above-mentioned first electrode 2a and second electrode 2b can be formed by, for example, disposing metal films on the electrodes by plating and then performing polishing or cutting to make the surfaces flat.

Distributed Bragg reflector (DBR) layers or the like may be disposed between the first electrode 2a and the first semiconductor layer and between the second electrode 2b and the second semiconductor layer to the extent that their electrical connections are not impaired. A DBR has, for example, a multilayer structure in which low-refractive-index layers and high-refractive-index layers are layered on an underlying layer optionally composed of an oxide film. The DBR selectively reflects light with predetermined wavelengths.

Specifically, films having various refractive indices and thicknesses which are to reflect a quarter of wavelength of wavelength, are alternately layered, thereby enabling reflection at the predetermined wavelength in a highly efficient manner. The films can contain materials such as oxides and nitrides of at least one element selected from the group consisting of Si, Ti, Zr, Nb, Ta, and Al.

Light-Transmissive Adhesives 3 and 203

The light-transmissive adhesive 3 or 203 is preferably used to dispose and bond the light-emitting element 2 on the light-transmissive member 10 or 210.

For the light-transmissive adhesive 3 or 203, it is preferable to use a light-transmissive resin, and a liquid material being curable to achieve bonding. Particularly preferable examples of such a light-transmissive resin include thermosetting resins, such as silicone resins, modified silicone resins, epoxy resins, and phenolic resins. The light-transmissive adhesive 3 or 203 is in contact with the light-transmissive member 1 and the light-extracting surface and lateral surfaces of the light-emitting element 2, thereby being likely to be affected by heat generated by the light-emitting element 2 while the light-emitting element 2 is lighting up. Thermosetting resins are suitably used for the light-transmissive adhesive 3 due to its heat resistant. The light-transmissive adhesive 3 or 203 preferably has a highly light transmittance.

The light-transmissive adhesive 3 or 203 may contain an additive that scatters light. Such an additive makes light emitted between the light-emitting elements 2 uniform within the light-transmissive adhesive 3. A filler, such as Aerosil, may be added to adjust the refractive index of the light-transmissive adhesive or the viscosity of the light-transmissive member before being cured (liquid resin material 31 or 231). This adjustment can inhibit or prevent the light-transmissive adhesive 3 or 203 from excessively flowing and spreading, and allows the light-emitting element 2 or 202 to be stably disposed on the projecting portion 12 or 212 of the light-transmissive member.

Light-Emitting Devices 100 and 200

The size of the emitting surface of the light-emitting device 100 or 200 is, for example, substantially equal to the planar shape of the above-mentioned light-transmissive encapsulating member 1 or 201, but the light-emitting device 100 or 200 is larger than the light-transmissive encapsulating member 1 or 201 by the size of the light-reflective member 4 or 204 disposed around the light-transmissive encapsulating member 1 or 201.

Preferably, the height of the light-emitting device 100 or 200 (i.e., L3 in FIG. 13A) is, for example, about 300 µm to about 700 µm. This structure allows the width of a frame of a backlight apparatus to be reduced in the case where, for example, the light-emitting device is incorporated into the backlight apparatus such that the light incident end surface of a light-guiding plate is parallel to the emitting surface. For the same reason, portions of the electrodes 302a and 302b of the light-emitting element exposed on the outer surface of the light-emitting device 300 as shown in FIG. 13B for example, are preferably used as electrodes for mounting the light-emitting device 300. Also, a thin metal layer is preferably disposed across the surfaces of the electrodes 302a and 302b of the light-emitting element 302 and the surface of the light-reflective member 304. This structure makes the light-emitting device small or slim.

Example 1

A silicone resin, a YAG:Ce phosphor, and about 2 wt % of Aerosil relative to the resin are first mixed in a centrifugal defoaming mixer.

The resulting mixture is applied to a release film formed of a fluororesin, and then shaped with a doctor blade into a sheet having a thickness of 150 µm. The resulting sheet is cured at 150° C. for 8 hours. A base member for a light-transmissive member is thus formed.

The base member for the light-transmissive member that has been cured is attached to the upper surface of a supporting member formed by bonding a heat-resistant UV sheet having adhesive layers on its both surfaces to a glass member that can transmit UV light.

The base member for the light-transmissive member is diced with a dicing saw along the longitudinal and lateral directions to form a plurality of groove portions, thereby forming a plurality of projecting portions each having the shape of the light-emitting portion of an intended light-emitting device.

At this time, the thickness of a light-reflective member of the light-emitting device to be obtained is ensured by adjusting the thickness of the dicing blade to the sum of the thickness of the light-reflective member after being cut and the thickness of a blade used in the final dicing of the products. The sum is, for example, about 200 µm.

A liquid resin material containing 2 wt % of Aerosil in a silicone resin is applied by dispensing to a plurality of separate portions on the upper surface of each of the projecting portions of the light-transmissive member.

A light-emitting element, in which a light-transmissive sapphire substrate constituting the light-extracting surface, a semiconductor layer, and electrodes are included, is disposed on the upper surface of each projecting portion of the light-transmissive member such that the sapphire substrate faces the upper surface of the light-transmissive member. The dimensions of the light-emitting element is about 200 µm in width, about 800 µm in length, and about 150 µm in height. The liquid resin material is then cured to be changed into the light-transmissive adhesive, and bonds the light-emitting element to the light-transmissive member. At this time, the light-transmissive adhesive is disposed between lateral surfaces of adjacent light-emitting elements, and is formed into a shape broadening from the lower surface of each light-emitting element toward the light-transmissive member on end portions of the light-transmissive member in the width direction.

A silicone resin is mixed with 2 wt % of silica with an average particle diameter of 14 µm, and 60 wt % of titanium oxide with an average particle diameter of 0.3 µm as inorganic particles relative to the weight of the silicone resin to prepare a material for the light-reflective member.

The light-reflective member is then shaped by compression molding with a mold and cured to integrally cover all of the upper surfaces of the supporting member, the projecting portions of the light-transmissive member, the light-transmissive adhesive, and the light-emitting elements disposed thereon.

The base portion and part of the projecting portions of the light-transmissive member and the light-reflective member are ground to expose the projecting portions of the light-transmissive member from the light-reflective member.

The light-reflective member is ground from the surface opposite to the light-transmissive member to expose the electrodes.

The light-reflective member is cut by dicing on the basis of the positions of the exposed electrodes of the light-emitting elements to provide a plurality of light-emitting devices.

UV light is applied to the heat-resistant UV sheet through the supporting member to weaken the adhesiveness of the adhesive layers of the sheet. The light-emitting devices are then removed from the UV sheet.

The light-emitting devices can be obtained by the above-mentioned method.

Example 2

A composition, which is a phosphor-containing sheet, is first provided in substantially the same or similar manner as in Example 1.

Subsequently, 2 wt % of Aerosil is added to a silicone resin, and the resulting mixture is mixed in a centrifugal defoaming mixer. The resulting mixture is applied to a release film formed of a fluororesin, and then shaped with a doctor blade into a sheet having a thickness of 150 µm to provide a transparent sheet.

Subsequently, the sheets are each semi-cured at 120° C. for 1 hour.

The semi-cured phosphor-containing sheet and transparent sheet are then bonded to each other at 80° C. with a pressure of 0.5 MPa.

The bonded sheets are fully cured at 150° C. for 8 hours.

A base member 11 for a light-transmissive member with a thickness of 270 µm including a phosphor-containing layer 11a, which is the phosphor-containing sheet, and a phosphor-free layer 11b, which is the transparent sheet, is provided through the above-mentioned steps.

The base member 11 for the light-transmissive member is attached to a supporting member 50 including an adhesive layer 50a, which is a UV sheet, in substantially the same or similar manner as in Example 1. At this time, the phosphor-free layer 11b is bonded to the UV sheet.

Subsequently, the base member 11 for the light-transmissive member is diced to form projecting portions 12. The height of a blade is adjusted so that 50 µm of the thickness of the phosphor-free layer 11b remains uncut. In other words, the base member 11 for the light-transmissive member is cut into a shape that includes a base portion with a thickness of 50 µm formed of the phosphor-free layer 11b and the projecting portions 12 separated from one another above the base portion. Part of the phosphor-free layer 11b on the surface in contact with the supporting member 50 is not divided but is continuous. The projecting portions 12, in which the phosphor-free layer 12b and the phosphor-containing layer 12a are layered, each have a height of 220 µm from the upper surface of the base portion 13. This structure inhibits or prevents the light-transmissive member 10 from being deformed by a pressure during formation of a light-reflective member 4, and inhibits or prevents the light-reflective member 4 from intruding the gap between the supporting member 50 and the light-transmissive member 10 in the later performed shaping step.

Subsequently, mounting of the light-emitting elements 2, forming of the light-reflective member 4, and exposure of the electrodes 2a and 2b of the light-emitting elements 2 are performed in substantially the same or similar manner as in the first embodiment.

UV light is then radiated to the adhesive layer 50a through the supporting member 50 to weaken the adhesiveness of the layer 50a, and the base member 11 for the light-transmissive member is removed from the supporting member 50 and transferred to another supporting member including a UV sheet. At this time, transferring is performed such that the supporting member 50 is bonded to the surface of the light-reflective member 4 on which the electrodes 2a and 2b of the light-emitting elements 2 are exposed.

Subsequently, the base member 11 for the light-transmissive member is ground to remove the base portion 13 of the light-transmissive member, part of the base member 41 for the light-reflective member 4, and part of the phosphor-free layer 12b constituting the projecting portions 12.

The base member 41 for the light-reflective member is then cut by dicing on the basis of the positions of light-transmissive encapsulating members 1 exposed.

UV light is radiated to the adhesive layer through a glass temporary supporting member to cure the adhesive layer, and resulting light-emitting devices 100 are removed from the supporting member.

By the above-mentioned method, the light-emitting devices 100 can be obtained, each of which the phosphor-free layer 11b is disposed on the emitting surface side of the light-transmissive encapsulating member.

The phosphor-free portions 11b and 12b are removed when the base portion 13 and projecting portions 12 of the light-transmissive member are removed in this method, therefore, the thickness of the phosphor-containing portions 12a does not vary due to the removal. Accordingly, variances in emission color of the light-emitting devices 100 to be manufactured can be reduced. Also, the phosphor contained in the phosphor-containing layer is protected because removal of the phosphor-free portion does not expose the phosphor-containing layer 12a during the removal. Removal of the phosphor-containing member is unnecessary, therefore, the required amount of the phosphor and the material costs can be reduced. The phosphor-free portion 1b is disposed on the outer surface of the light-emitting device 100, the phosphor-containing layer 1a can be protected.

Example 3

In the present example, the light-emitting device 300 shown in FIG. 13A to FIG. 13E is manufactured. The upper surface of a projecting portion of a light-transmissive member used for manufacturing the light-emitting device 300 has a length L5 in the width direction of about 300 µm and a length L4 in the longitudinal direction of about 49,500 µm in a plan view, and the height of the upper surface is about 120 µm from the upper surface of a base portion of the light-transmissive member. On the projecting portion of the light-transmissive member, thirty three pieces of light-emitting elements 302 each having dimensions of 200 µm in width, 1,000 µm in length, and 150 µm in height are disposed at intervals of 500 µm. A light-transmissive adhesive 303 is disposed continuously between the light-emitting elements 302. Other than the above-mentioned steps, the light-emitting device is manufactured in substantially the same or similar manner as in Example 2. The linear light-emitting device that is long in the longitudinal direction as shown in FIG. 13A to FIG. 13E is thus easily manufactured. The light-emitting device 300 shown in FIGS. 13A to 13E includes: the light-emitting elements 302 each having the longitudinal direction side and the width direction side in a plan view; a light-transmissive encapsulating member 301 having the longitudinal direction side and the width direction side in a plan view; a light-transmissive adhesive 303 that bonds the light-emitting elements 302 to the light-transmissive encapsulating member 301; and a light-reflective member 304 that covers the lateral surfaces of the light-emitting elements 302, the light-transmissive adhesive 303, and the lateral surfaces of the light-transmissive encapsulating member 301. The light-emitting elements 302 are aligned such that their longitudinal directions sides coincide with the longitudinal direction side of the light-transmissive member 301, and the light-transmissive adhesive 303 is disposed between lateral surfaces of the adjacent light-emitting elements 302.

The light-emitting device 300 can be suitably used as a light source for an end-face-incident backlight. Regarding an electronic apparatus including a display in which a light-emitting device is used as a light source for a backlight apparatus, the need for slimming down the bezel of a display panel (i.e., expanding the effective area of the screen within the panel) is increasing recently to increase the proportion of the display area to the size of the surface including the display area. However, in the case where a light-emitting device, in which a plurality of light-emitting elements are aligned, is used as the light-emitting device as the light source for the backlight apparatus, the intensity and color of light emitted from the light-emitting device depend on the angle. Non-uniformity in brightness and color is therefore large in the vicinity of the light-emitting device, and the light-emitting device is not suitable for the display area. Hence, there has been a problem in that a certain range from the light-emitting device 300 cannot be used as the display area, that is, expansion of the display area is difficult.

The structure of the light-emitting device 300 obtained in the present example, however, allows light emitted from the light-emitting elements 302 to be uniformized within the light-transmissive adhesive 303 disposed between the light-emitting elements 302 before entering the light-transmissive encapsulating member 301, so that the light is emitted substantially uniformly from the surface of the light-transmissive encapsulating member 301. This structure reduces the dependence of the intensity or color of light emitted from the light-emitting device 300 on the angle and enables the light-emitting device 300 to be disposed near the light-guiding plate of the backlight apparatus. The frame of the backlight apparatus can be therefore slimmed down, and the display area of the backlight apparatus can be expanded. Accordingly, a display (i.e., lighting apparatus) 390 as shown in FIG. 14, in which the light-emitting device 300 in the present example can have an expanded display area.

Example 4

Figure 15A:
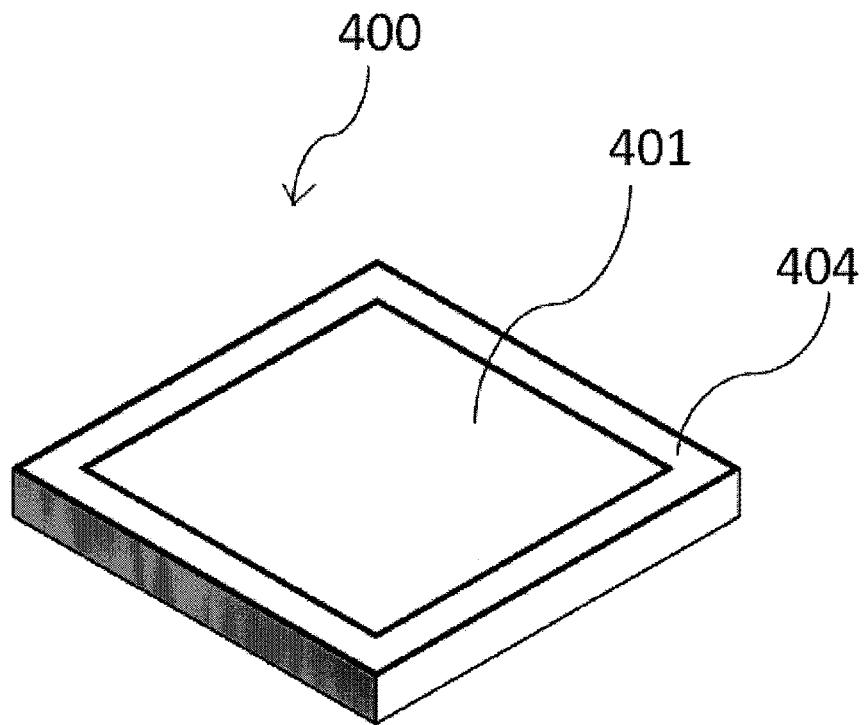
FIG. 15A is a schematic perspective view of a light-emitting device according to Example 4.
Figure 15B:
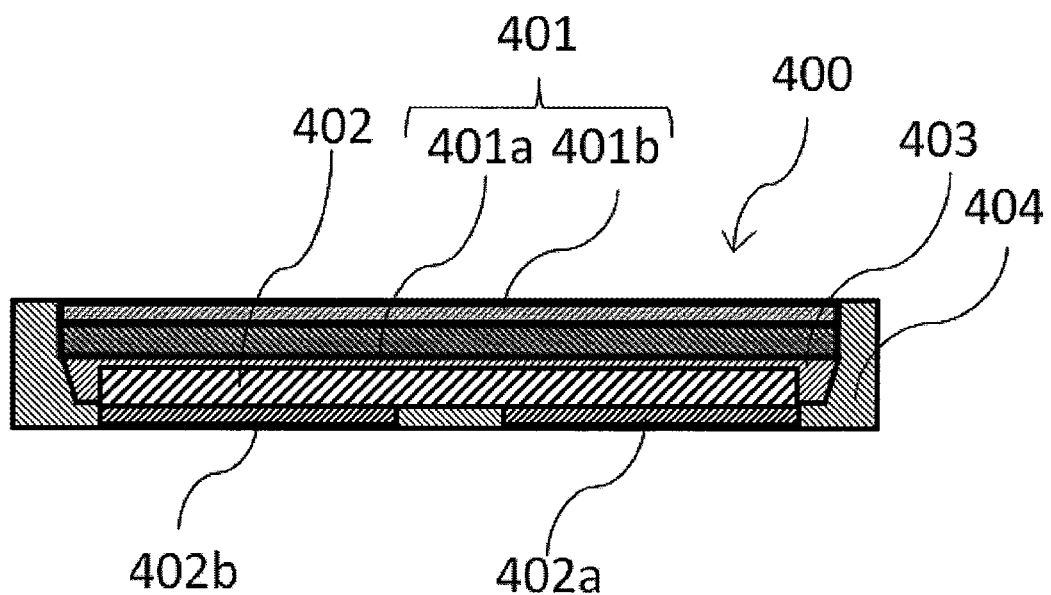
FIG. 15B is a schematic sectional view of the light-emitting device in FIG. 15A.

In the present example, the upper surface of a projecting portion of a light-transmissive member has a substantially square shape of 1,100 µm×1,100 µm dimensions. A substantially square light-emitting element 402 having 1,000 µm×1,000 µm dimensions is disposed on the projecting portion. Other than the above-mentioned steps, a light-emitting device is manufactured in substantially the same or similar manner as in Example 2. The light-emitting device 400 as shown in FIG. 15A and FIG. 15B is thus easily manufactured. The light-emitting device 400 is small and is thus suitably used for a flash for a camera in a smartphone, or a plurality of such light-emitting devices arranged in a matrix is suitably used for a direct-lit backlight, for example.

Several embodiments and examples according to the present invention have been illustrated above, but the present invention is not limited to the above-mentioned embodiments or examples. Needless to say, any modifications are possible within the scope of the present invention.

The light-emitting devices disclosed in the present specification may be each used as a top-view light-emitting device, in which the light-emitting device is mounted such that its emitting surface faces in the direction opposite to the mounting board, or as a side-view light-emitting device, in which the light-emitting device is mounted such that the plane of its emitting surface extending in a direction intersecting with, preferably substantially perpendicularly to, the mounting surface.

What is claimed is:
1. A method for manufacturing a light-emitting device, the method comprising:
   providing a light-transmissive member comprising:
      a base portion, and
      a projecting portion on a first surface side of the base portion,
      wherein a base material for the light-transmissive member comprises a layered structure that includes:
         at least one phosphor-containing portion, and at least one phosphor-free portion comprising substantially no phosphor particles, and
wherein the projecting portion comprises the phosphor-containing portion and a part of the phosphor-free portion;
providing a light-emitting element that has a main emitting surface and an electrode formation surface opposite to the main emitting surface;
disposing the light-emitting element on the projecting portion of the light-transmissive member such that the main emitting surface of the light-emitting element faces an upper surface of the projecting portion of the light-transmissive member; and
forming a light-reflective member that covers (i) lateral surfaces of the light-emitting element, (ii) lateral surfaces of the projecting portion of the light-transmissive member, and (iii) the first surface of the base portion, wherein the light-reflective member is in contact with at least the lateral surfaces of the projecting portion of the light-transmissive member and the first surface of the base portion.

2. The method for manufacturing a light-emitting device according to claim 1,
wherein the light-transmissive member comprises a plurality of projecting portions connected to each other via the base portion; and
wherein the method further comprises:
removing the base portion of the light-transmissive member, and
cutting the light-reflective member between the projecting portions.

3. The method for manufacturing a light-emitting device according to claim 2, wherein, in the step of removing the base portion of the light-transmissive member, part of the projecting portions of the light-transmissive member and part of the light-reflective member are also removed.

4. The method for manufacturing a light-emitting device according to claim 1,
wherein the light-transmissive member comprises a plurality of projecting portions connected to each other via the base portion;
wherein the step of providing a light-emitting element comprises providing a plurality of light-emitting elements, each having a main emitting surface and an electrode formation surface opposite to the main emitting surface; and
wherein each light-emitting element is disposed on a respective one of the projecting portions.

5. The method for manufacturing a light-emitting device according to claim 1,
wherein the step of providing the light-transmissive member comprises
forming the projecting portion by forming at least one groove in the phosphor-containing portion and partially in the phosphor-free portion.

6. The method for manufacturing a light-emitting device according to claim 5, further comprising removing the base portion of the light-transmissive member, which removes part of the phosphor-free portion.

7. The method for manufacturing a light-emitting device according to claim 1, wherein, in the step of disposing the light-emitting element on the light-transmissive member, the light-emitting element is disposed on the light-transmissive member with a light-transmissive adhesive disposed therebetween.

8. The method for manufacturing a light-emitting device according to claim 7,
wherein the light-transmissive member comprises a plurality of projecting portions connected to each other via the base portion;
wherein the step of providing a light-emitting element comprises providing a plurality of light-emitting elements, each having a main emitting surface and an electrode formation surface opposite to the main emitting surface;
wherein each light-emitting element is disposed on a respective one of the projecting portions; and
wherein the light-transmissive adhesive connects at least a part of lateral surfaces of adjacent ones of the light-emitting elements.

* * * * *